(12) United States Patent
Yoshida

(10) Patent No.: US 7,184,594 B1
(45) Date of Patent: Feb. 27, 2007

(54) PATTERN MATCHING METHOD AND DEVICE, POSITION DETERMINING METHOD AND DEVICE, POSITION ALIGNING METHOD AND DEVICE, EXPOSING METHOD AND DEVICE, AND DEVICE AND ITS PRODUCTION METHOD

(75) Inventor: Kouji Yoshida, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/869,293

(22) PCT Filed: Jan. 18, 2000

(86) PCT No.: PCT/JP00/00182

§ 371 (c)(1),
(2), (4) Date: Aug. 27, 2001

(87) PCT Pub. No.: WO00/42640

PCT Pub. Date: Jul. 20, 2000

(30) Foreign Application Priority Data

Jan. 18, 1999 (JP) .................................. 11-008986

(51) Int. Cl.
*G06K 9/62* (2006.01)
*G06K 9/60* (2006.01)

(52) U.S. Cl. .................. 382/209; 382/151; 382/156

(58) Field of Classification Search ............... 382/151, 382/170, 155–160, 209, 217
See application file for complete search history.

(56) References Cited

U.S. PATENT DOCUMENTS

| | | | | |
|---|---|---|---|---|
| 3,191,149 A | * | 6/1965 | Andrews | 382/309 |
| 4,179,693 A | * | 12/1979 | Evans et al. | 342/64 |
| 4,461,028 A | * | 7/1984 | Okubo | 382/155 |
| 4,971,444 A | | 11/1990 | Kato | |
| 5,016,981 A | * | 5/1991 | Peppers et al. | 359/888 |
| 5,479,537 A | * | 12/1995 | Hamashima et al. | 382/266 |
| 5,568,564 A | * | 10/1996 | Ozaki | 382/149 |
| 5,859,698 A | * | 1/1999 | Chau et al. | 382/149 |
| 6,608,920 B1 | * | 8/2003 | Su et al. | 382/151 |

FOREIGN PATENT DOCUMENTS

| | | |
|---|---|---|
| JP | 4-23421 | 1/1992 |
| JP | 10-97983 | 4/1998 |
| JP | 10-326739 | 12/1998 |

* cited by examiner

*Primary Examiner*—Bhavesh M. Mehta
*Assistant Examiner*—Manav Seth
(74) *Attorney, Agent, or Firm*—Oblon, Spivak, McClelland, Maier & Neustadt, P.C.

(57) ABSTRACT

A template creating unit (32) creates a waveform template formed of expectations of a signal waveform of the value of each parameter and a probability template formed of information on occurrence probability of each expectation of the parameters on the basis of the signal waveform measured. A matching judging unit (33) performs template matching of another signal waveform measured while using the expectation occurrence probability information included in the probability template as weight information for each parameter value. Further the template creating unit (32) creates a waveform template and a probability template considering the measured another signal waveform and prepares for the next pattern matching. Thus template matching is performed with improved matching accuracy for waveform of a signal varying with the value of a parameter.

12 Claims, 10 Drawing Sheets

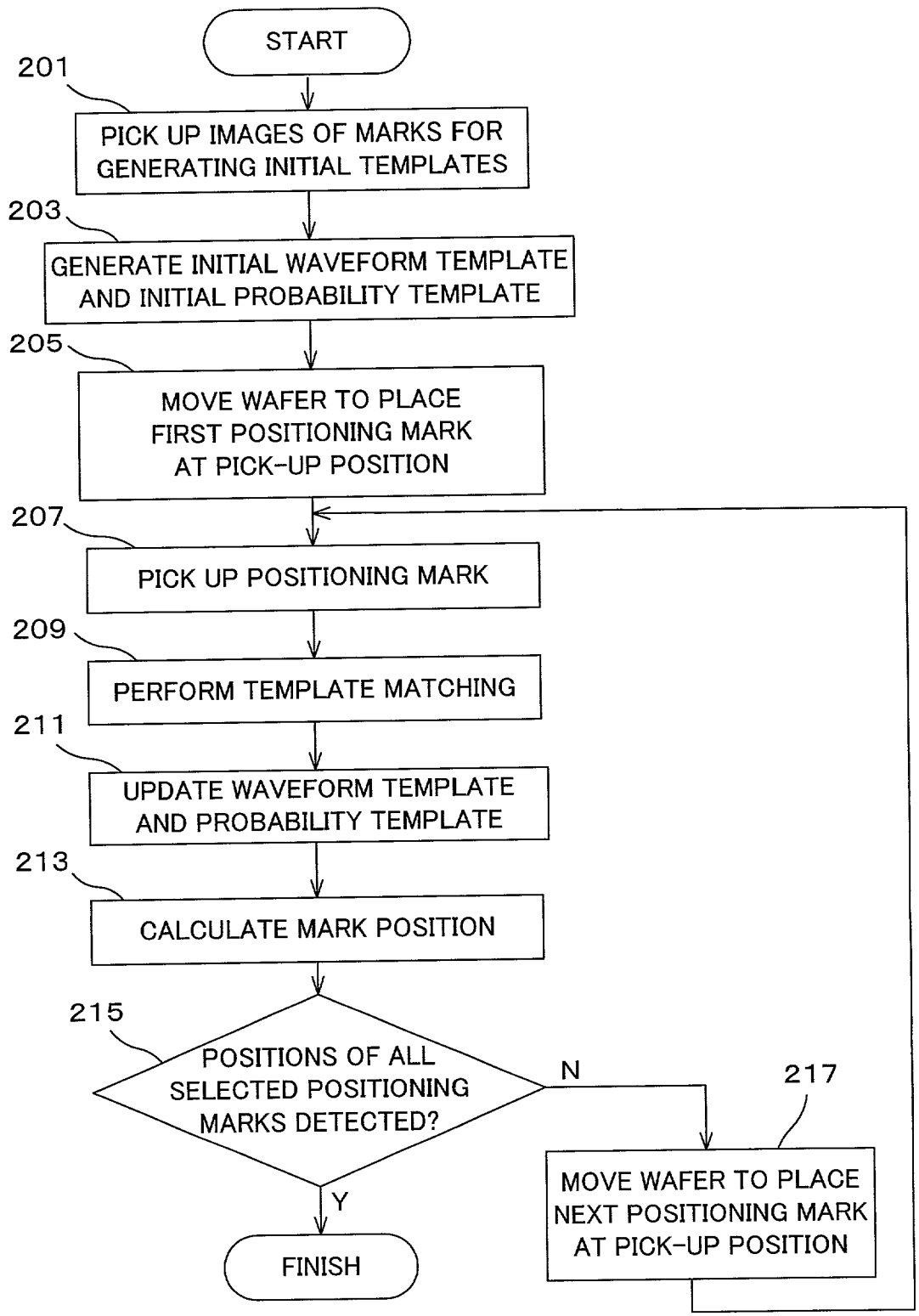

PATTERN MATCHING METHOD AND DEVICE, POSITION DETERMINING METHOD AND DEVICE, POSITION ALIGNING METHOD AND DEVICE, EXPOSING METHOD AND DEVICE, AND DEVICE AND ITS PRODUCTION METHOD

TECHNICAL FIELD

The present invention relates to a pattern matching method and unit, a position detection method and unit, a alignment method and unit, an exposure method and apparatus, and a device and its manufacturing method, and more specifically to a pattern matching method and pattern matching unit using a template generated from actually measured signal waveforms, a position detection method and positional detector to detect the position of a body to be detected on the basis of results of performing pattern matching on a new signal waveform through use of the pattern matching method, a alignment method and unit to align the detected body on the basis of results of detecting the position of the detected body through use of the position detection method, an exposure method and exposure apparatus to transfer a pattern onto a substrate while aligning the substrate through use of the alignment method, and a device manufactured by using the exposure method and its manufacturing method.

BACKGROUND ART

In a lithography process for manufacturing a semiconductor element, liquid crystal display element, or the like, an exposure apparatus has been used which transfers a pattern formed on a mask or reticle (to be generically referred to as a "reticle" hereinafter) onto a substrate such as a wafer or glass plate (to be referred to as a "wafer" hereinafter) through a projection optical system. As such an exposure apparatus, a stationary-exposure-type projection exposure apparatus such as the so-called stepper, or a scanning-exposure-type projection exposure apparatus such as the so-called scanning stepper is mainly used.

In such an exposure apparatus, it is necessary to perform highly accurate alignment between the reticle and wafer before exposure. To perform this alignment, because a position detection mark (alignment mark) that is formed (transferred) in the previous photolithography process is provide on each shot area on the wafer, by detecting this alignment mark, the position of the wafer (or a circuit pattern on the wafer) can be detected. And on the basis of the detection result of the position of the wafer (or a circuit pattern on the wafer), the alignment is performed.

Therefore, the accuracy of alignment is determined by the accuracy of detecting the position of the alignment mark. Accordingly, to perform the alignment with high accuracy, it is necessary to detect the position of the alignment mark with high accuracy.

Several methods of detecting the position of an alignment mark on a wafer are actually used. However, in any method, by analyzing the waveform of a detected signal of the alignment mark that is obtained by a detector for position detection, the position of the alignment mark on the wafer is detected. For example, in position detection through use of image detection that is popularly used these days, the position of the alignment mark is detected by picking up an optical image of the alignment mark through use of a picking-up unit and analyzing the light intensity distribution of its picked-up signal, i.e. the image.

As such a method of analyzing a signal waveform, a pattern matching (template matching) method which examines correlation between the signal waveform and a template waveform, which is prepared beforehand, by using as a parameter the position of the alignment mark that is detected by picking-up is attracting a lot of attention. By analyzing a signal waveform through use of this pattern matching method and obtaining a value of the parameter at which the correlation between the signal waveform and the template waveform is highest, the position of the alignment mark is detected.

As a template used for the above pattern matching, a theoretical signal waveform obtained from the design shape of the alignment mark, or a waveform composed of average values obtained by calculating the average of measured waveforms of a predetermined number of alignment marks has been used.

When using the above theoretical signal waveform as the template waveform, depending on difference between the design shape of the alignment mark and its actual shape, non-negligible error may occur in the detection result of the position of the alignment mark. As opposed to this, such an error can be avoided by using the above average-value-waveform as the template waveform.

Although the average-value-waveform has been obtained by calculating the average of the respective values (e.g., voltage values reflecting light intensity), at each position on a coordinate, of a plurality of measured signal waveforms, in actually measured signal waveforms, there are positions where the signal level of any of the signal waveforms is near the average and other positions where their signal levels are somewhat different. Therefore, when the differences of the signal levels in some positions are very large, accurate position may be detected by performing pattern matching while taking into account positions except for those positions rather than taking all positions into account, even though the amount of processing decreases.

Because the number of signal waveforms that are measured beforehand to generate the average-value-waveform as the template waveform is finite, the accuracy of matching with a newly measured signal waveform having a shape that is not reflected by the template waveform is always low. Especially, when a newly measured signal waveform can not be expressed as interpolation of signal waveforms used for generation of the template waveform, the matching accuracy decreases. To avoid such a situation, it is necessary to measure a huge amount of signal waveforms beforehand and generate a template waveform covering all possible signal waveforms, and therefore it takes a lot of time to generate the template in order to prepare for the template matching.

The present invention is invented under such a circumstance. A first purpose of the present invention is to provide a pattern matching method and pattern matching unit that can easily generate a template and perform template matching with improved accuracy.

In addition, a second purpose of the present invention is to provide a position detection method and positional detector that can accurately detect the positions of measured marks.

In addition, a third purpose of the present invention is to provide a alignment method and alignment unit that can accurately align a body on which the marks are formed.

Furthermore, a fourth purpose of the present invention is to provide an exposure method and exposure apparatus that can accurately transfer a predetermined pattern onto a substrate.

Additionally, a fifth purpose of the present invention is to provide a device on which a fine pattern is accurately formed and its manufacturing method.

DISCLOSURE OF INVENTION

According to the first aspect of the present invention, there is provided a first pattern matching method of performing template matching on a waveform of a signal, a value of the signal varying according to value change of at least a parameter, the pattern matching method comprising: a first step of estimating an occurrence probability distribution of signal values at respective values of the parameter, based on a plurality of measured signal waveforms; a second step of generating a waveform template including an expected value of signal value at each value of the parameter and a probability template including a piece of occurrence probability information of the expected value at each value of the parameter based on the occurrence probability distribution; and a third step of performing template matching between a newly measured signal waveform and the waveform template by using the piece of occurrence probability information of each of the expected values, composing the probability template, as a piece of weight information at each value of the parameter.

In this pattern matching method, when performing template matching between the waveform template and a new signal waveform, the correlation computation uses weights, at respective values of the parameter, each of which is in accord with the occurrence probability of the value of the waveform template at the respective value of the parameter, the value of the waveform template being the expected value of a signal waveform at the respective value of the parameter. That is, when the occurrence probability of the expected value is high, the weight is large, and when the occurrence probability of the expected value is low, the weight is small. As a result, in measured signal waveforms used to generate the waveform template, at values of the parameter where any of the signal waveforms takes values around the expected value, the weight is large, and at other values of the parameter where the signal level varies among the signal waveforms, the weight is small. Therefore, template matching can be performed that reasonably reflects a whole pattern information corresponding to the measured signal waveforms used to generate the waveform template. Therefore, compared with previous template matching methods, more accurate template-matching can be performed.

In the first pattern matching of this invention, a normal distribution can be used as the above occurrence probability distribution. In this way, especially when deviation of the measured signals can be considered to follow a normal distribution, it is valid to presume the occurrence probability distribution to be a normal distribution. Note that when the occurrence probability distribution is known, the probability distribution can be used, and that meanwhile, when the occurrence is entirely unknown, it is reasonable to presume the occurrence probability to be a normal distribution, which is the most general distribution.

Moreover, in the first pattern matching of this invention, the expected value can be set to an average value of measured signal values at each value of the parameter, and also, the piece of occurrence probability information can be set according to a probability density function value of the occurrence probability distribution for the expected value. In such a case, the waveform template and the probability template can be easily generated from signal waveforms to be used for generating the template. For example, considering the occurrence probability to be a normal distribution, the occurrence probability is highest at the expected value, in each value of the parameter, and representing the parameter by X and a standard deviation by σ, the piece of occurrence probability information P(X) is simply given by the following equation:

$$P(X)=1/\{(2\pi)^{1/2}\sigma\} \qquad (1)$$

Additionally, the first pattern matching of this invention can further comprises a fourth step of generating a new waveform template composed of new expected values of a signal waveform at the respective values of the parameter and a new probability template composed of pieces of occurrence probability information of the new expected values at the respective values of the parameter on the basis of the new signal waveform and the occurrence probability, and repeat the fourth and third steps subsequently. In such a case, every time when a new signal waveform is measured, and when pattern matching is performed, the waveform template and the probability template are updated by adding the new signal waveform to the templates. That is, every time when a new waveform is measured, learning is performed, and results thereof are added to the templates. Accordingly, when a signal waveform having a shape not reflected by the templates has been measured, in the next measurement of a similar signal waveform, accurate template matching will be performed. That is, templates with desirable accuracy of matching can be generated.

The second aspect of this invention is to provide a second pattern matching method of performing template matching between subsequently measured signal waveforms and a waveform template generated on the basis of a plurality of measured signal waveforms, the second method comprising a first step of performing template matching between the template and a newly measured signal waveform; and a second step of generating a new template on the basis of a plurality of signal waveforms including the new waveform; and wherein the first and second steps are repeated subsequently.

According to this method, in the same manner as the above case of performing learning on a new waveform, when a signal waveform having a shape not reflected by the template has been measured, in the next measurement of a similar signal waveform, accurate template matching will be performed.

In the second pattern matching of this invention, the second step can further comprises a third step of estimating an occurrence probability distribution of signal values at the respective values of the parameter related to the change of a waveform on the basis of the plurality of signal waveforms; and a fourth step of generating a probability template composed of pieces of occurrence probability information of the expected values at the respective values of the parameter.

In such a case, when performing template matching between the obtained waveform template and a new signal waveform in the first step, a correlation computation according to occurrence probability values of expected values of signal values at the respective values of the parameter can be performed by referring to the probability template, the expected values being the waveform template's values at the respective values of the parameter, and a waveform template and probability template that are statistically reasonable can be provided to prepare for the next measurement. Therefore, pattern matching can be performed statistically reasonably reflecting the whole pattern information corresponding to a plurality of measured signal waveforms used for generating the waveform template.

In the same manner as the first pattern matching of this invention, the occurrence probability distribution can be set to be a normal distribution; the expected value can be set to an average value of measured signal values at each value of the parameter, and the piece of occurrence probability information can be set according to a probability density function value of the occurrence probability for the expected value.

The third aspect of this invention is to provide a first pattern matching unit to perform template matching on signal waveforms varying with value change of at least one parameter, the first pattern matching unit comprising a template generation unit to generate a waveform template that is estimated from a plurality of measured signal waveforms and composed of expected values, of signal values, at the respective values of the parameter and a probability template composed of pieces of occurrence probability information of the expected values at the respective values of the parameter; and a matching judgment unit to perform template matching between a newly measured signal waveform and the waveform template while using the piece of occurrence probability information of each expected value in the probability template as weight at the respective value of the parameter.

According to this, the template generation unit generates the waveform template that is estimated from a plurality of measured signal waveforms and composed of expected values, of signal values, at the respective values of the parameter and the probability template composed of the pieces of occurrence probability information of the expected values at the respective values of the parameter, and the matching judgment unit performs template matching between a newly measured signal waveform and the waveform template while using the piece of occurrence probability information of each expected value in the probability template as weight at the respective value of the parameter. That is, the pattern matching unit of this invention performs pattern matching through use of the first pattern matching method of this invention. Accordingly, upon the template matching, because pattern information corresponding to a plurality of measured signal waveforms is reflected by the waveform template, the pattern matching unit of this invention can perform more accurate template matching.

In the first pattern matching unit, the template generation unit can generate a new waveform template and probability template on the basis of the new signal waveform and the occurrence probability distribution. In such a case, pattern matching further comprising the above learning function can be performed.

The fourth aspect of this invention is to provide a second pattern matching unit to perform template matching, the second pattern matching unit comprising a template generation unit to generate a waveform template on the basis of a plurality of measured signal waveforms; and a matching judgment unit to perform template matching between a newly measured signal waveform and the waveform template, wherein the template generation unit generates a new template on the basis of the plurality of signal waveforms and the new signal waveform.

According to this, because pattern matching is performed through use of the second pattern matching method, in the next measurement of a signal waveform similar to the newly measured signal waveform having a new shape, the second pattern matching unit can perform accurate template matching.

The fifth aspect of this invention is to provide a position detection method of detecting a position of a specific mark formed on a detected body, the detection method comprising a first measurement step of measuring a plurality of marks having almost the same shape as the specific mark, the marks being formed on the detected body; a second measurement step of measuring the specific mark; a pattern matching step of performing pattern matching through use of a pattern matching method according to this invention, the pattern matching method using signal waveforms measured at the plurality of marks as a plurality of signal waveforms, a signal waveform measured at the specific mark as a new signal waveform, and positions as values of a parameter; and a position detection step of obtaining position information of the specific mark on the basis of the pattern matching results.

According to this, by generating the waveform template and the probability template according to the pattern matching method of this invention by using measured signal waveforms, the pattern matching is accurately performed. And because on the basis of the template matching results the position information of the specific mark, as a detected object, is detected, the position detection can be accurately performed.

In a position detection method of this invention, in a case where the specific mark changes periodically in a first direction, by setting the values of the parameter to be positions in the first direction, the specific mark's positional information in the first direction can be detected. Additionally, in a position detection method of this invention, in a case where the specific mark also changes periodically in a second direction that is different from the first direction, by letting the parameter to represent two-dimensional position in a plane defined by the first and second directions, the two-dimensional position of the specific mark in the plane can be detected.

The sixth aspect of this invention is to provide a positional detector for detecting a position of a specific mark formed on a detected body, comprising a measurement unit measuring the specific mark and a plurality of marks having almost the same shape as the specific mark, the marks being formed on the detected body; a pattern matching unit according to this invention, performing pattern matching by using signal waveforms measured at the plurality of marks as a plurality of signal waveforms, a signal waveform measured at the specific mark as a new signal waveform, and positions as values of a parameter; and a processing unit to obtain positional information of the specific mark on the basis of the pattern matching results.

According to this, by detecting the position of the mark by using the position detection method of this invention, the positional information of the mark can be accurately detected.

In a positional detector according to this invention, the measurement unit may comprise a picking-up unit to pick up marks formed on the detected body, and the signal waveform is composed of changes, between positions, of a light intensity in a mark image picked up by the picking-up unit.

The seventh aspect of this invention is to provide a alignment method of aligning a detected body on which a first number of marks having almost the same shape as one another are formed, comprising a mark position detection step of detecting positional information of a second number of marks through use of a position detection method according to this invention, by sequentially using as a specific mark each of the second number of marks selected from the first number of marks; and a alignment step of aligning the detected body based on the positional information of the second number of marks detected in the mark position detection step.

According to this, by accurately detecting the positional information of the second number of marks formed on a detected body through use of the position detection method of this invention and aligning the detected body on the basis of the detection results, the detected body can be accurately aligned.

The eighth aspect of this invention is to provide a alignment unit for aligning a detected body on which a first number of marks having almost the same shape as one another are formed, comprising a position detector according to this invention detecting positional information of a second number of marks by sequentially using as a specific mark each of the second number of marks selected from the first number of marks; and a position controller to align the detected body on the basis of the positional information of the second number of marks detected in the position detector.

According to this, by accurately detecting the positional information of the second number of marks formed on a detected body through use of the position detection method of this invention and aligning the detected body on the basis of the detection results, the detected body can be accurately positioned.

The ninth aspect of this invention is to provide a exposure method of transferring a pattern formed on a mask onto divided areas on a substrate, comprising a divided area position detection step in which positional information of the divided areas on the substrate is obtained by detecting positional information, relative to the substrate, of a second number of alignment marks through use of a position detection method according to this invention while sequentially using as a specific mark each of the second number of alignment marks selected from a first number of alignment marks that are formed on the substrate as a detected body and have almost the same shape; and a transferring step of transferring the pattern onto the divided areas while aligning the substrate based on the positional information of the divided areas on the substrate obtained in the divided area position detection step.

According to this, while accurately detecting the positional information of the second number of alignment marks formed on the substrate through use of the position detection method of this invention and aligning the substrate on the basis of the detection results, the pattern is transferred onto the divided areas. That is, while accurately aligning the substrate through use of the position detection method of this invention, the pattern is transferred onto the divided areas. Accordingly, the pattern can be accurately transferred onto the divided areas.

The exposure method of this invention can be one wherein the plurality of divided areas are disposed in a matrix-shape on the substrate, wherein the alignment mark comprises a third number of a first alignment marks having almost the same shape as one another and a fourth number of a second alignment marks having almost the same shape as one another, the first and second alignment marks being used respectively for aligning in the row direction of the matrix and for aligning in the column direction of the matrix, wherein in the divided area position detection step, positional information, in the row direction on the substrate, of a fifth number of first alignment marks is obtained through use of a position detection method according to this invention while sequentially using as a specific mark each of the fifth number of first alignment marks selected from the third number of first alignment marks, and also positional information, in the column direction on the substrate, of a sixth number of second alignment marks is obtained through use of a position detection method, according to this invention, sequentially using as a specific mark each of the sixth number of second alignment marks selected from the fourth number of second alignment marks, and wherein positional information, relative to the substrate, of the divided areas is obtained by statistically processing the positional information in the row direction of the fifth number of first alignment marks and the positional information in the column direction of the sixth number of second alignment marks. In such a case, the two-dimensional position information of the divided areas on the substrate can be accurately detected, and while accurately aligning the substrate on the basis of the detection results, the pattern is transferred onto the divided areas. Therefore, the pattern can be accurately transferred onto any of the divided areas arranged in a matrix-shape.

The tenth aspect of this invention is to provide an exposure apparatus for transferring a pattern formed on a mask onto divided areas on a substrate, comprising a stage unit moving the substrate along a predetermined plane; and a position detector according to this invention, obtaining positional information of a second number of positional marks by sequentially using as a specific mark each of the second number of alignment marks selected from a first number of alignment marks that are formed on the substrate as a detected body and have almost the same shape as one another.

According to this, while accurately detecting the positional information of the divided areas by detecting the positional information of marks formed on the substrate through use of the positional detector of this invention and while aligning the substrate on the basis of the detection results by using the stage unit, exposure of the second or later layers is performed on the divided areas so that a predetermined pattern is transferred onto the substrate. Therefore, multi-exposure for forming a multi-layer pattern can be performed with improved accuracy of superposition between the layers.

It is noted that by assembling and adjusting the above stage unit, position detector, and other various elements and units mechanically, optically, and electrically, an exposure apparatus according to this invention can be made which transfers a pattern onto the divided areas on the substrate.

In addition, in a lithography process, by performing exposure using an exposure apparatus according to the present invention, it is possible to form a multi-layer pattern on a substrate with high accuracy of superposition, and therefore it is possible to manufacture a more highly integrated micro device with high yield, and the productivity can be improved. Accordingly, another aspect of the present invention is a device manufactured by using an exposure apparatus of the present invention and a method of manufacturing a device using an exposure method of the present invention.

BRIEF DESCRIPTION OF THE DRAWINGS

FIG. 5 is a flow chart for explaining an operation of detecting the positions of the marks;

BEST MODE FOR CARRYING OUT THE INVENTION

An embodiment of the present invention will be described below with referring to FIGS. 1 to 11.

Figure 1:
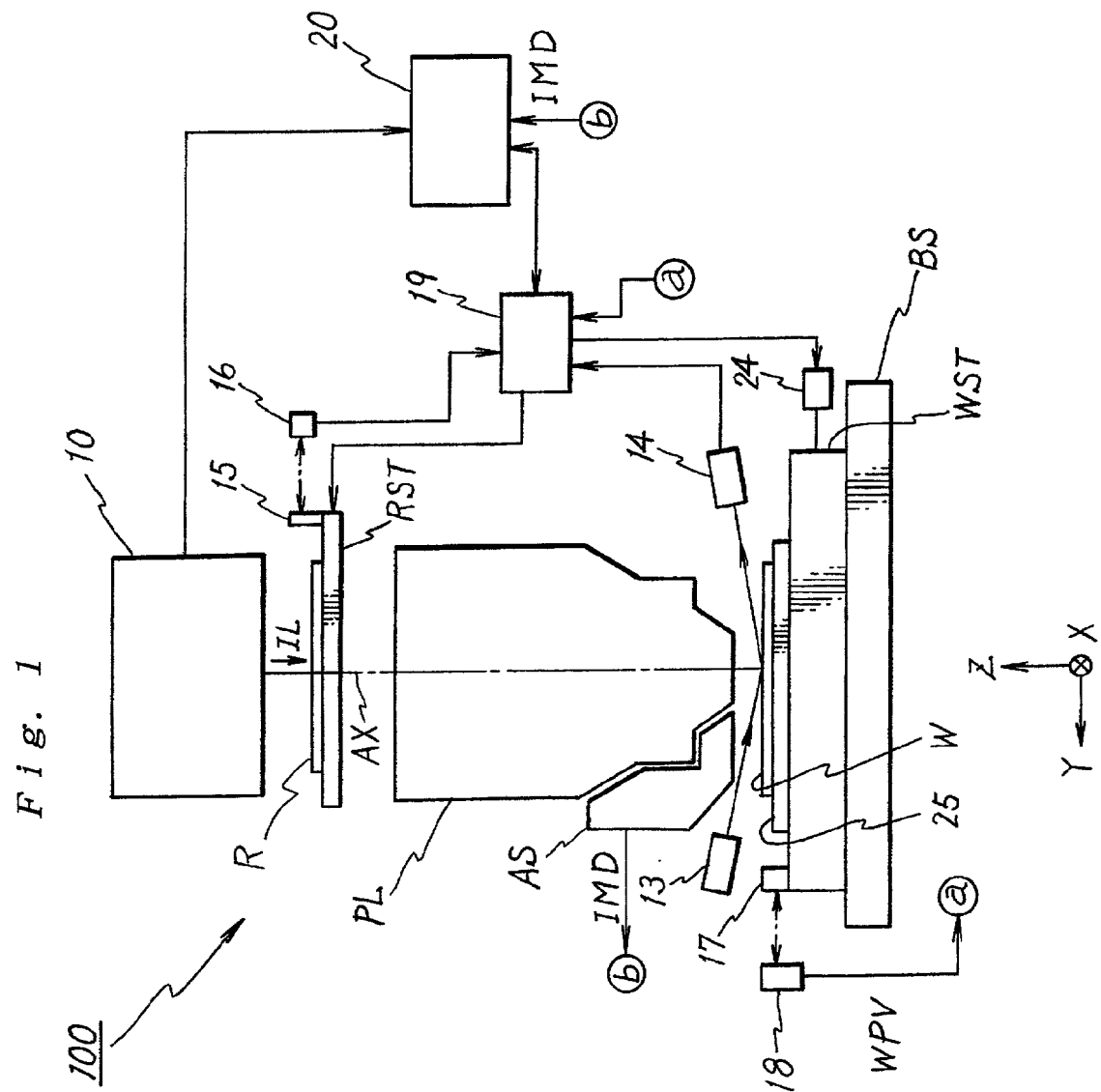
FIG. 1 is a schematic view showing the arrangement of an exposure apparatus according to an embodiment.

FIG. 1 shows the schematic arrangement of an exposure apparatus 100 according to the embodiment. This exposure apparatus 100 includes an illumination system, a reticle stage RST serving as a mask stage for holding the reticle, a projection optical system PL, a wafer stage WST serving as a stage unit on which a wafer W as a substrate (a body to be detected) is mounted, an alignment microscope AS serving as an image-pick-up unit, a main control system 20 to comprehensively control the whole system and the like.

The illumination system housing comprises, a light source, an illuminance uniformization optical system including a fly-eye lens as an optical integrator and the like, a relay lens, a variable ND filter, a reticle blind, a dichroic mirror, and the like (all are not shown). The arrangement of such an illumination system is, for example, disclosed in Japanese Patent Laid-Open No. 10-112433. As a light source unit, KrF excimer laser (oscillation wavelength 248 nm), ArF excimer laser (oscillation wavelength 193 nm), $F_2$ laser (oscillation wavelength 157 nm), $Kr_2$ (krypton dimmer) laser (oscillation wavelength 146 nm), $Ar_2$ (argon dimmer) laser (oscillation wavelength 126 nm), a harmonic wave generator using copper vapor laser or YAG laser, an ultrahigh pressure mercury lamp (g-line, i-line, etc.), or the like is used. Note that instead of light emitted from the above light source, X-ray or a charged particle beam such as an electron beam can be used.

The function of the illumination system 10 having this arrangement will be briefly described below. Illumination light emitted from the light source unit is incident onto the illuminance uniformization optical system when the shutter is open. As a consequence, many secondary sources are formed at the exit end of the illuminance uniformization optical system. Illumination light radiated from these secondary sources reaches the reticle blind through the beam splitter and condenser lens system. The illumination light having passed through the reticle blind is sent out through an imaging lens system. A slit-like illumination area, which is defined by the reticle blind, on the reticle R on which a circuit pattern is drawn is illuminated with the illumination light IL having uniform illuminance by the illumination optical system IOP.

On the reticle stage RST, a reticle R is fixed by, e.g., vacuum chucking. The retilce stage RST can be finely driven in X-Y plane perpendicular to the optical axis (coinciding exactly with the optical axis AX of a projection optical system PL) of the illumination system 10 by a reticle stage driving portion (not shown) composed of a magnetic-levitation-type, two-dimensional linear actuator, and can be driven at a designated scanning speed in a predetermined scanning direction (hereafter, it is set to be the Y-direction). Furthermore, in the present embodiment, because the magnetic-levitation-type, two-dimensional linear actuator comprises a Z-driving coil as well as a X-driving coil and a Y-driving coil, the reticle stage RST can be driven in Z-direction.

The position of the reticle stage RST in the plane where the stage moves is detected all the time through a movable mirror 15 by a reticle laser interferometer 16 (hereafter, referred to as a "reticle interferometer") with resolution of, e.g., 0.5 to 1 nm. The positional information of the reticle stage RST from the reticle interferometer 16 is sent to a stage control system 19, and the stage control system 19 drives the reticle stage RST through a reticle stage driving portion (not shown) on the basis of the positional information of the reticle stage RST.

The projection optical system is arranged below the reticle stage RST in FIG. 1, and its optical axis AX is set to be the Z-axis direction. Because, as the projection optical system PL, a refraction optical system that is bilaterally telecentric and has a predetermined reduction ratio, e.g. 1/5, 1/4 or 1/6, is employed, when the illumination area of the reticle R is illuminated with the exposure illumination light IL from the illumination optical system, the reduced image (partially inverted image) of a circuit pattern in the illumination area on the reticle is formed on a wafer W coated with resist (photosensitive material) via the projection optical system PL by the illumination light IL having passed the reticle R.

The wafer stage WST is provided on a base BS below the reticle stage RST in FIG. 1, and a wafer holder 25 is mounted on the wafer stage WST. On this wafer holder 25, the wafer W is fixed by, e.g., vacuum chuck or the like. The wafer holder 25 is so structured that it can be tilted in any direction with respect to a plane perpendicular to the optical axis of the projection optical system PL and can be finely moved in the direction of the optical axis AX (the Z-direction) of the projection optical system PL by a driving portion (not shown). The wafer holder 25 can also rotate finely about the optical axis AX.

The wafer stage WST is so structured that it can move not only in the scanning direction (the Y-direction) but also in a direction perpendicular to the scanning direction (the X-direction) so that a plurality of shot areas on the wafer can be positioned at an exposure area conjugated with the illumination area, and a step-and-scan operation is performed in which an operation of performing scanning-exposure to each shot area on the wafer and an operation of moving the wafer to the starting position of the next shot area are repeated. The wafer stage WST is driven in the X-Y, two-dimensional direction by a wafer-stage driving portion 24 including a motor, etc.

The position of the wafer stage WST in the X-Y plane is detected all the time through a movable mirror 17 by a wafer laser interferometer with resolution of, e.g., 0.5 to 1 nm. The positional information (or velocity information) WPV of the wafer stage WST is sent to the stage control system 19, and on the basis of the positional information (or velocity information) WPV, the stage control system 19 controls the wafer stage WST.

Figure 2A:
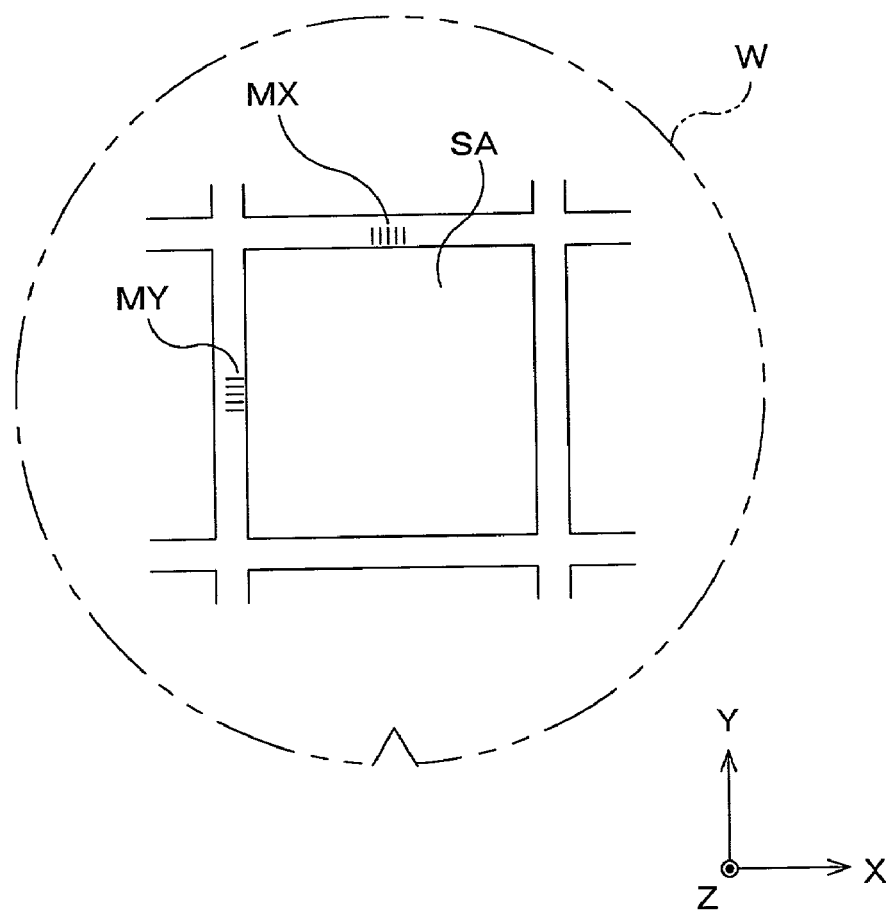
FIGS. 2A and 2B are views for explaining exemplary alignment marks.
Figure 2B:
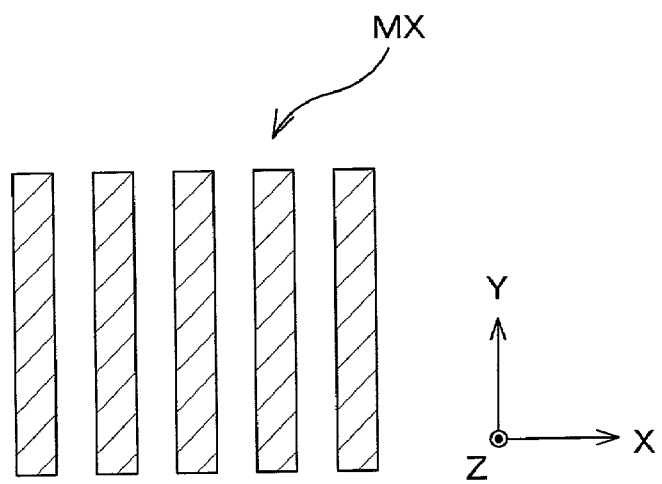

The alignment microscope AS is an alignment sensor of an off-axis method provided on the side surface of the projection optical system PL. The alignment microscope AS outputs the picked-up result of an alignment mark (wafer mark) provided on each shot area on the wafer. As the alignment mark, for example, mark MX for detecting a X-direction position and mark MY for detecting a Y-direction position that are formed on a street line around the shot-are SA on the wafer as shown in FIG. 2A are used, these marks being alignment-marks. Therefore, in practice, two alignment microscopes, one for detecting a X-direction position and the other for detecting a Y-direction position, are arranged. In FIG. 1, however, the two alignment microscopes are representatively shown by the alignment microscope AS. As each of MX and MY marks, a line-and-space mark having a structure periodic in a direction to detect the positions can be used. the line-and-space mark being representatively shown by the mark MX, which is shown on a larger scale in FIG. 2B. The alignment microscope AS sends picked-up data IMD, which is the picked-up result, to the main control system 20 (refer to FIG. 1).

Figure 3A:
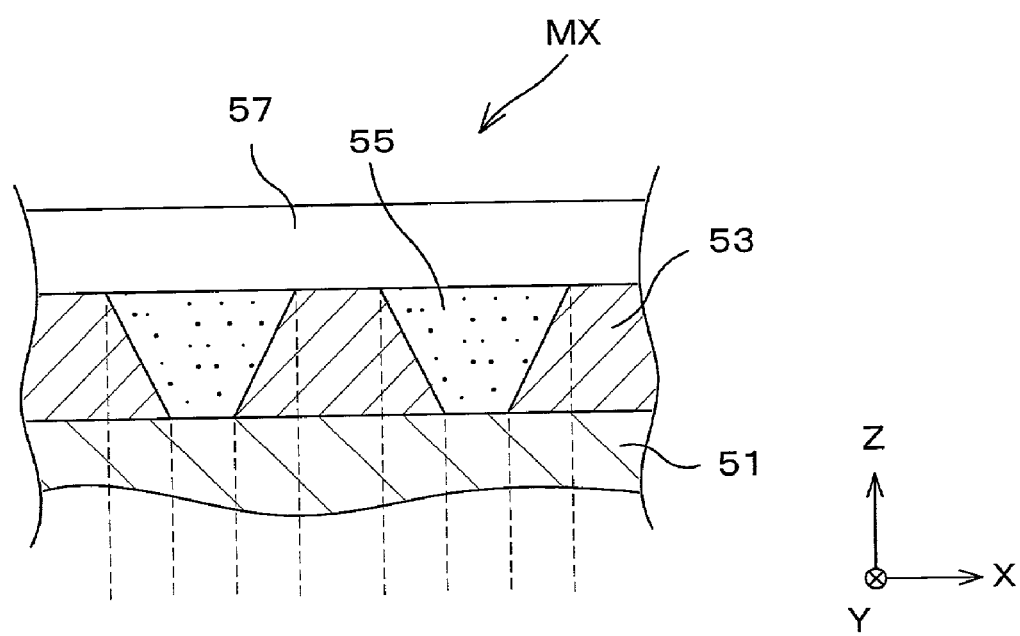
FIGS. 3A and 3B are respectively a view showing an exemplary structure of a portion where the alignment mark is formed and a view for explaining ideal results of picking up the positional mark.

In the mark-MX-formed area on the wafer W, as shown by the X-Z cross-sectional view of FIG. 3A, line portions 53 and space portions 55 are alternately formed in the X-direction on a base layer 51, and on the surface of line portions 53 and space portions 55, a resist layer 57 is formed. Materials of the base layer 51 and the line portion 53 are different from each other, and those materials are different from each other in reflectance and transmission. Also, materials of the line portion 53 and the space portion 55 are different from each other, and those materials are generally different from each other in reflectance and transmission.

Hereafter, assume that the material of the line portion 53 is aluminum or the like having high reflectance, that the material of the base layer 51 is lower in reflectance than that of the line portion 53, and that the material of the space portion 55 is lower in reflectance than that of the base layer 51. Also, assume that the upper surface of the base layer 51, the line portion 53, and the space portion 55, and the boundary surface between the line portion 53 and the space portion 55 are almost flat. When shining the illumination light from above and observing an image formed by the reflection light, reflected by the mark-MX-formed area, from above, the X-direction distribution of light intensity I of the image is the one shown in FIG. 3B. That is, in the observed image, the light intensity is largest and constant in a position corresponding to the upper surface of the line portion 53, and between the upper surface of the line portion 53 and the upper surface of the base layer 51, the light intensity changes in a J-letter shape.

Figure 4:
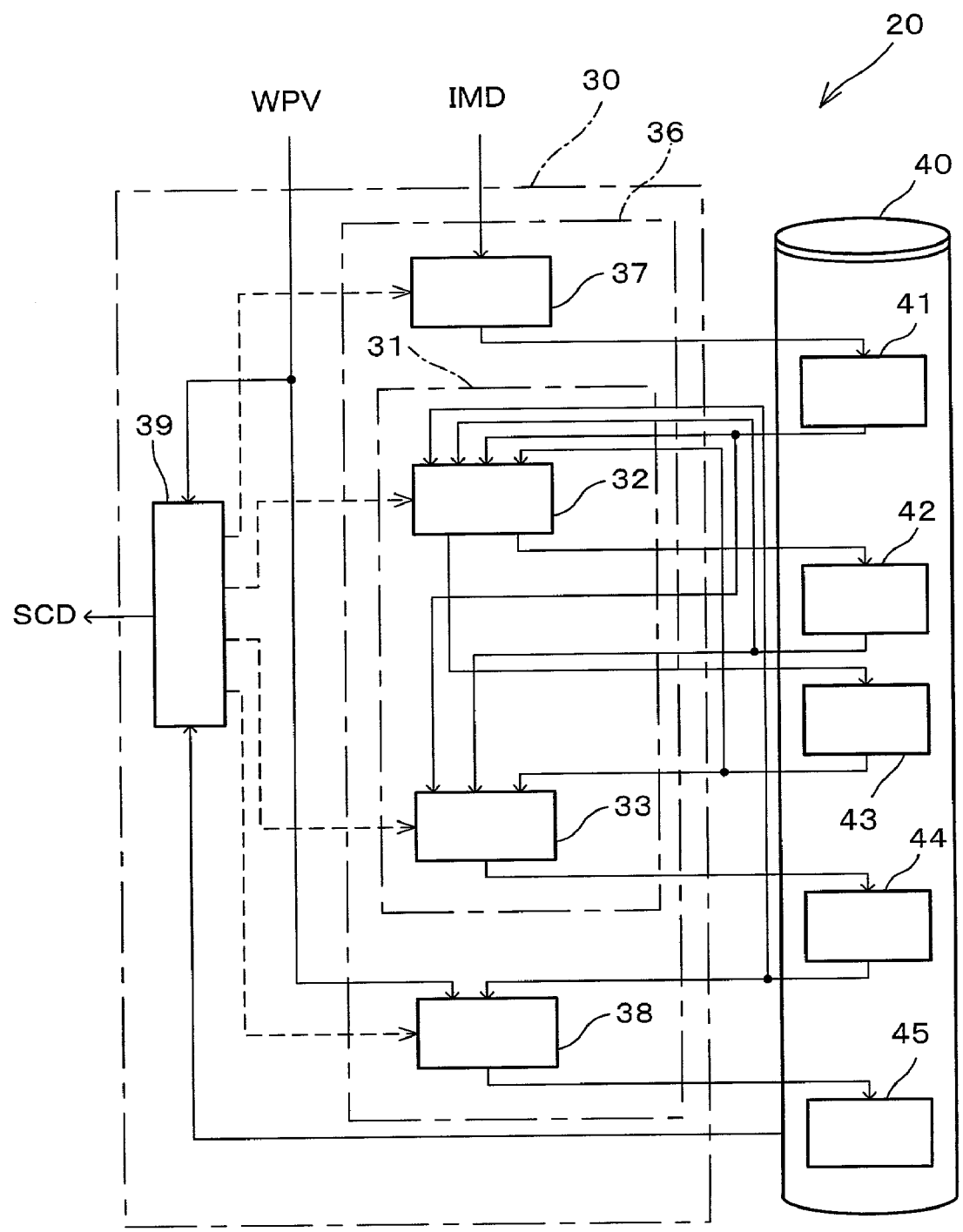
FIG. 4 is a schematic view showing the arrangement of a main control system.

The main control system 20 comprises, as shown in FIG. 4, the main controller 30 and a storage unit 40. The main controller 30 is composed of a controller 39, which controls the exposure unit 100 by supplying stage control data SCD to the stage control system 19 and doing other things, and a position computing unit 36, and the position computing unit 36 comprises a pattern-matching unit 31, a picked-up image collection unit 37, and a mark-position calculating unit 38 as a processing unit. And the pattern-matching unit 31 comprises a template generator 32 and a matching judgment unit 33, and the storage unit 40 includes a picked-up-data storing area 41, a waveform-template storing area 42, a probability-template storing area 43, a pattern-matching-result storing area 44 and a mark-position storing area 45. The alignment microscope AS and the position computing unit 36 compose a position detector, and The alignment microscope AS and the picked-up image collection unit 37 compose a measurement unit. Incidentally, in FIG. 4, the flows of data are represented by solid lines with an arrow, and the flows of control are by dotted lines with an arrow. The action of each unit of the main control system 20 will be described later.

Note that although, in the present embodiment, the main controller 30 is composed of the above units, the main controller 30 may be a computer system in which the functions of the above units are realized by programs stored in the main controller 30.

Referring back to FIG. 1, in the exposure apparatus 100, a multi-focal detection system of an oblique-incidence method is fixed on a supporting portion (not shown) to support the projection optical system PL, the detection system being composed of an illumination optical system 13 that shines an imaging-beam, to form a plurality of slit-images, toward the best-image plane of the projection optical system PL in an oblique direction relative to the optical axis AX direction and a light-receiving optical system 14 to receive the beams reflected by the surface of the wafer W through the respective slits.

The stage control system 19 drives the wafer holder 25 in the Z-direction and in an oblique direction on the basis of the wafer position information from this multi-focal position detection system (13, 14). Such a multi-focal position detection system is disclosed in, for example, Japanese Patent Laid-Open No. 6-283403 and its corresponding U.S. Pat. No. 5,448,332. The disclosures in the above Japanese Patent Laid-Open and U.S. patent are incorporated herein by reference as long as the national laws in designated states or elected states, to which this international application is applied, permit.

The exposure apparatus 100 having the arrangement described above detects the information of positions, on the wafer W, of predetermined marks MX, MY formed on the wafer W in a manner that will be described below. Note that as a premise for detecting the positional information of the marks MX, MY, the marks MX, MY are assumed to have been already formed on the wafer up to the previous process (e.g., the process for the first layer). In addition, assume that the wafer, which is coated with resist after a layer made of a predetermined material is formed on the wafer surface by, for example, a chemical-vapor-deposition method (CVD) and the like, is loaded into the wafer holder 25 by a wafer loader (not shown), and that the main control system 20 has moved the wafer W via the stage control system 19 such that each of the marks MX, MY are placed within the observing sight of the alignment microscope AS, this operation being called a coarse alignment (pre-alignment). This pre-alignment is performed via the stage control system 19 by the main control system 20 (specifically, the controller 39) on the basis of observation of the outline of the wafer, observation results of the marks MX, MY in a wide sight and the positional information (or velocity information) from the wafer interferometer 18.

Additionally, consider that X-position information, on the wafer, of a predetermined number (hereafter, set to be M) of selected X-position-detection marks $MX_i$ (i=1 to M) and Y-position information, on the wafer, of a predetermined number (hereafter, set to be N) of selected Y-position-detection marks $MY_h$ (h=1 to N) are to be detected and that the mark-MX-formed area and MY-formed area on the wafer W are structured in the same way as in FIG. 3A except for the degree of flatness of the boundary surfaces and the surface of the resist layer 57.

Although, in the below description, the X-position information and Y-position information, on the wafer, of the marks MX, MY are considered to designate positions (coordinate positions) in a stationary coordinate that defines the movement of the wafer W, the X-position information and Y-position information are not limited to coordinate positions in a stationary coordinate, and these pieces of information may designate the amounts of deviations from design values regarding the marks MX, MY. As a way to obtain these deviation-amounts, there is a method where the marks MX, My are observed after they have been moved to under the alignment microscope AS on the basis of design values (positional information used when the marks MX, MY are transferred onto the wafer), and where using the observation results, the amounts of deviations, of position of the marks MX, MY, from a predetermined observation-reference in the alignment microscope AS are obtained.

Next, position detection of X-position detection mark $MX_i$ and Y-position detection mark $MY_h$ will be described below referring mainly to a flow chart shown in FIG. 5 and also to other figures as the need arises.

On the detection of positions of M number of selected marks $MX_i$ (i=1 to M), first, in step 201 of FIG. 5, an alignment microscope ASX picks up a plurality (three in the present embodiment) of other marks MX than selected X-position-detection marks $MX_i$ to generate an initial template (an initial waveform template and initial probability template), and according to instructions from the controller 39, the picked-up data collection unit 37 stores picked-up data IMD, inputted thereto, into the picked-up-data storing area 41, and by this, picked-up data IMD are collected.

Figure 3B:
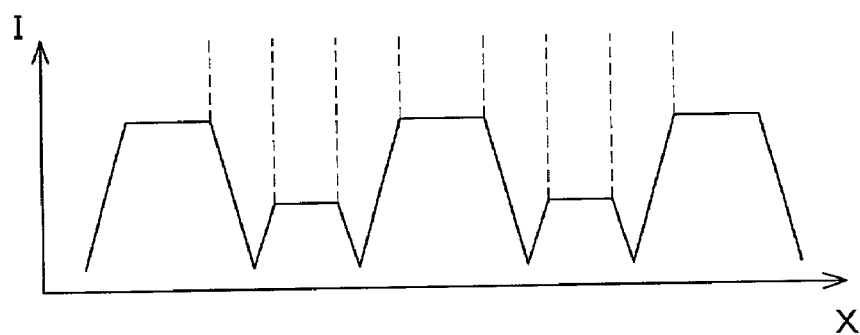
Figure 6A:
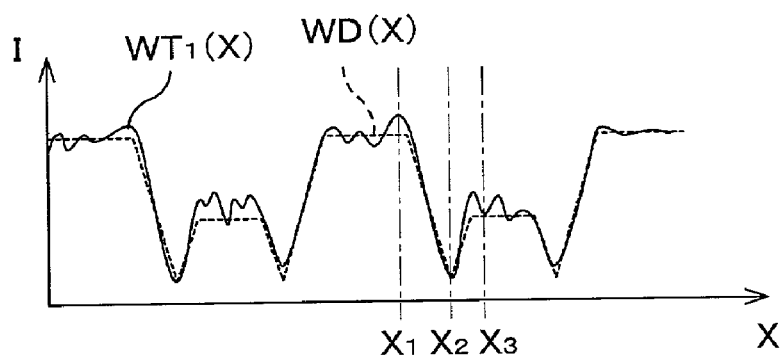
FIGS. 6A to 6C are views for explaining shapes of measured signal waveforms.
Figure 6B:
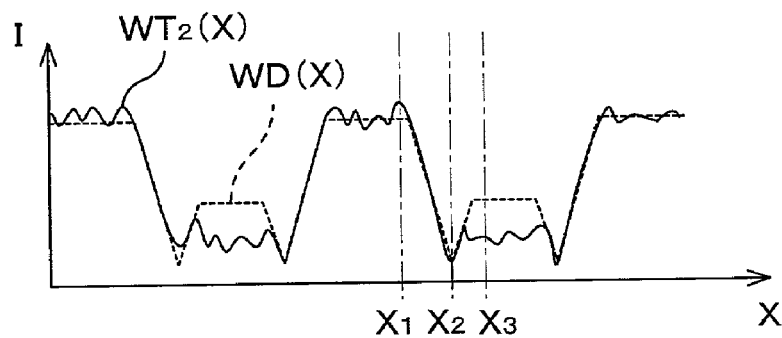
Figure 6C:
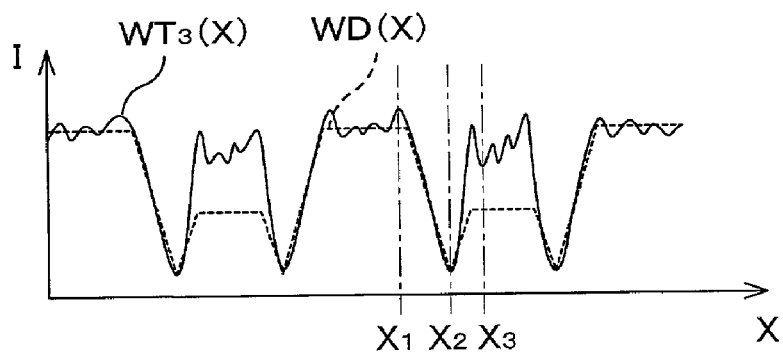

If the mark MX that was picked up is ideally shaped, the collected picked-up data IMD will take an ideal waveform in FIG. 3B. In practice, however, the mark MX is not always ideally shaped due to the fact that the boundary surfaces and the surface of the resist layer 57 are not ideally flat and the like. Therefore, actually measured signals takes waveforms shown by solid lines in FIGS. 6A to 6C. In FIGS. 6A to 6C, dotted lines represent the ideal, in terms of design, signal waveform in FIG. 3B.

A description will be presented below considering that three signal waveforms shown in FIGS. 6A to 6C have been measured in step 201.

Next, in step 203 of FIG. 5, according to instructions from the controller 39, the template generator 32 generates an initial waveform template and initial probability template. When generating the initial waveform template and initial probability template, first, the template generator 32 reads out the picked-up data of the three measured signal waveforms from the storing area 41.

The waveforms shown in FIGS. 6A to 6C are three different ones that are really measured in the X-axis space. Because their respective forming positions are different, there is a probability that actually measured signal waveforms are measured under different circumstances. Therefore, it is necessary to perform positional adjustment according to correspondence among the X-positions of those waveforms in order to compare or combine them at their respective positions corresponding to one another (abscissa positions (X positions) in FIGS. 6A to 6C).

Therefore, in the template generator 32, for each of the signals corresponding to picked-up data read out from the storing area 41, a position where the degree of matching with the ideal signal waveform in FIG. 3B, serving as a template, is highest is set to be the position of each mark MX. In this template matching, normalized correlation computation between the template waveform, i.e. the ideal waveform in terms of design, WD(X) and each of the signal waveforms $WT_k(X)$ (k=one to three) is performed as moving each signal waveform $WT_k(X)$ in the X-axis direction.

That is, X-range, for which normalized correlation computation is performed, is set to be equal to or larger than XS, which is small enough, and equal to or smaller than XE (=XS+n·ΔX; n being a constant, ΔX representing the picture-element pitch of picked-up data in X-direction), XE being large enough, and representing X-position parameter by δX, a correlation value $CT_k(\delta X)$ is obtained by $$CT_k(\delta X) = \sum_{j=0}^{n} \{WD(XS + j \cdot \Delta X) \cdot WT_k(XS + j \cdot \Delta X + \delta X)\} \quad (2)$$

and by calculating a value $\delta X_k$ at which each correlation value $CT_k(\delta X)$ becomes maximum and translating each signal waveform $WT_k(X)$ by the value $\delta X_k$ in the X-direction, the X-position of each signal waveform $WT_k(X)$ is adjusted. That is, using the ideal waveform WD(X), the X-position of each signal waveform $WT_k(X)$ is adjusted and corrected. Hereafter, the signal waveform adjusted in this way is represented by "$WT_k(X)$", which is the same as the one before the adjustment.

Figure 7A:
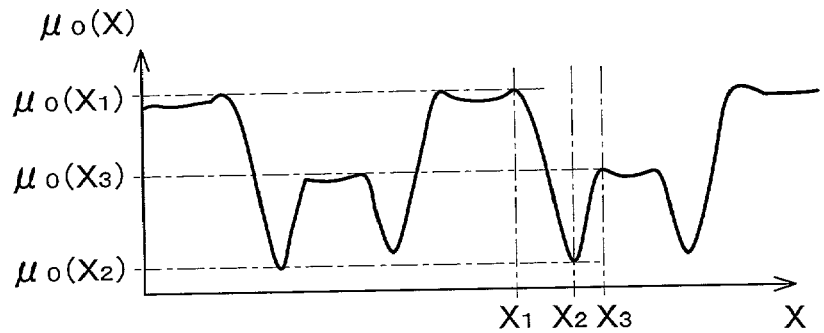
FIGS. 7A and 7B are views for explaining an initial waveform template and initial probability template, respectively.
Figure 7B:
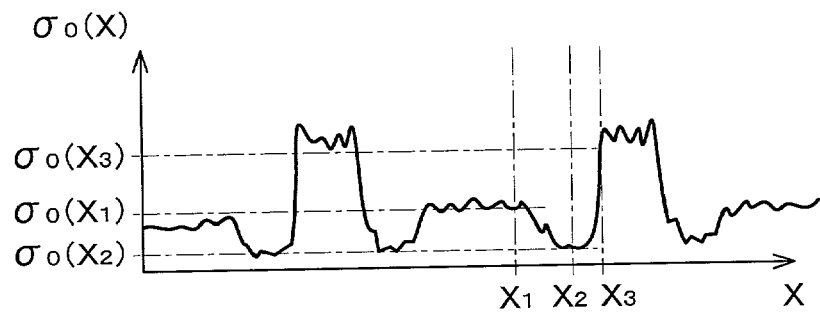

Next, the template generator 32 calculates the average value $\mu_0(X)$, at each X-position, of the light intensities $WT_k(X)$ on the basis of the signal waveforms $WT_k(X)$ by $$\mu_0(X) = \left(\sum_{k=1}^{3} WT_k(X)\right)/3 \quad (3)$$

and stores the average value $\mu_0(X)$ at each X-position into the waveform-template storing area 42. Hereafter, a group of the average values $\mu_0(X)$ is referred to as an initial waveform template, which is also represented by $\mu_0(X)$. Subsequently, the template generator 32 calculates the standard deviation $\sigma_0(X)$, at each X-position, of the light intensities $WT_k(X)$ on the basis of the signal waveforms $WT_k(X)$ and the average value $\mu_0(X)$ by $$\sigma_0(X) = \left[\left\{\sum_{k=1}^{3} (WT_k(X) - \mu_0(X))^2\right\}/3\right]^{1/2} \quad (4)$$

and stores the standard deviation $\sigma_0(X)$ at each X-position into the probability-template storing area 43. Hereafter, a group of the standard deviations $\sigma_0(X)$ is referred to as an initial probability template, which is also represented by $\sigma_0(X)$. The initial waveform template $\mu_0(X)$ is shown in FIG. 7A and the initial probability template $\sigma_0(X)$ is in FIG. 7B.

Figure 8:
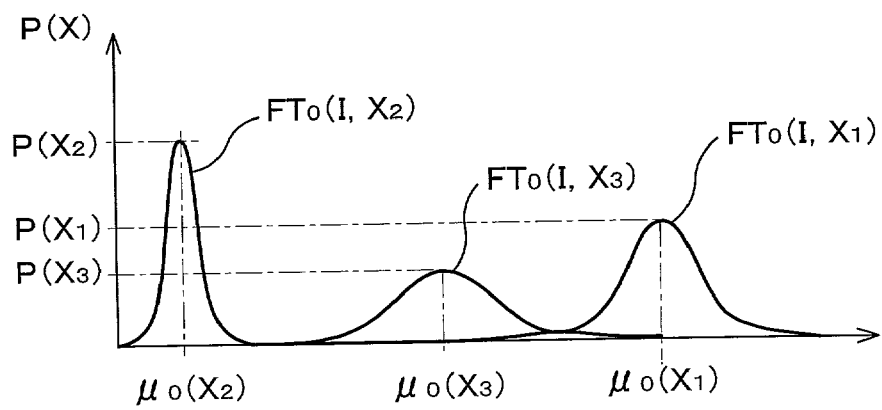
FIG. 8 is a view for explaining a probability distribution of a light intensity at each position.

Note that, as shown in FIG. 6A to FIG. 6C, in each signal waveform $WT_k(X)$, although at a bottom (e.g., around position $X_2$) of the waveform where the light intensity I is minimum or close to minimum, deviation of measurement values of the light intensity is small, deviation of measurement values of the light intensity at a first peak (e.g., around position $X_1$) of the waveform where the light intensity I is maximum or close to maximum is larger than that of the bottom. Additionally, note that at a second peak (e.g., around position $X_3$) of the waveform where the light intensity I takes a local maximum, which is greatly different from the maximum, deviation of measurement values of the light intensity is larger than that of the first peak. Considering that the respective distributions of the light intensities in X-positions $X_1$, $X_2$, $X_3$ are a normal distribution, as shown in FIG. 8, for position $X_2$, the average value is represented by $\mu_0(X_2)$, and occurrence probability $P(X_2)$ of the average value $\mu_0(X_2)$ is represented by the peak of a probability density function $FT_0(I,X_2)$ of which the shape is steep, and for position $X_1$, the average value is represented by $\mu_0(X_1)$, and occurrence probability $P(X_1)$ ($<P(X_2)$) of the average value $\mu_0(X_1)$ is represented by the peak of a probability density function $FT_0(I,X_1)$, of which the shape slops more gently than the probability density function $FT_0(I,X_2)$. Also, for position $X_3$, the average value is represented by $\mu_0(X_3)$, and occurrence probability $P(X_3)$ ($<P(X_1)$) of the average value $\mu_0(X_3)$ is represented by the peak of a probability density function $FT_0(I,X_3)$, of which the shape slops more gently than the probability density function $FT_0(I,X_1)$.

Next, the probability density function for each of X-positions $X_1$, $X_2$, $X_3$ in X coordinate is represented by the following equation:

$$FT_0(I(X)) = \frac{1}{\sqrt{2\pi} \cdot \sigma_0(X)} \exp\left[-\frac{(I(X) - \mu_0(X))^2}{2\sigma_0(X)^2}\right] \quad (5)$$

For each X position, the expected value of measured light intensity is equal to the average value $\mu_0(X)$, and the occurrence probability of the average value $\mu_0(X)$ takes the value $\{(2\pi)^{1/2} \cdot \sigma_0(X)\}^{-1}$. Therefore, the waveform template $\mu_0(X)$ represents a group of expected values for light intensities measured at the respective X-positions, and the probability template $\sigma_0(X)$ represents a group of values reflecting occurrence probabilities of expected values for light intensities measured at the respective X-positions.

In this way, the initial waveform template $\mu_0(X)$ and the initial probability template $\sigma_0(X)$ are generated.

Next, in step 205 of FIG. 5, the wafer W is moved such that the first mark $MX_1$ of the marks $MX_i (i=1$ to M) selected for aligning is placed within the pick-up sight of the alignment microscope AS. This movement of the wafer is performed by the controller 39 controlling the wafer driver 24 via the stage control system 19 on the basis of pre-alignment results and moving the wafer stage WST.

Subsequently, in step 207, the mark $MX_1$ is picked up, and picked-up data IMD are collected. This picking-up of the image and collection of the image data are performed by picking up the mark $MX_1$ through the alignment microscope ASX in the same manner as the above step 201 and by the picked-up data collection unit 37 storing picked-up data IMD, inputted thereto, into the picked-up-data storing area 41 according to instructions from the controller 39.

Next, in step 209, according to instructions from the controller 39, the matching judgment unit 33 performs template matching. In this template matching, first, the matching judgment unit 33 reads out picked-up image data regarding the mark $MX_1$ from the picked-up-data storing area 41 and from the waveform-template storing area 42 and then reads out the waveform template $\mu_0(X)$ and the probability template $\sigma_0(X)$ respectively from the waveform-template storing area 42 and the probability-template storing area 43.

Second, using the waveform template $\mu_0(X)$ and the probability template $\sigma_0(X)$, the matching judgment unit 33 calculates a correlation value $CR_1(\delta X)$ regarding a signal waveform $WP(X)$ corresponding to the picked-up image data regarding the mark $MX_1$ by $$CR_1(\delta X) = \quad (6)$$

-continued $$\sum_{j=0}^{n} \left\{ \left( \frac{1}{\sigma_0(XS + j \cdot \Delta X)} \right) \cdot \mu_0(XS + j \cdot \Delta X) \cdot WP_1(XS + j \cdot \Delta X + \delta X) \right\}$$

The value $CR_1(\delta X)$ is obtained for each X-position parameter $\delta X$. As seen in equation (6), the correlation value $CR_1(\delta X)$ regarding the mark $MX_1$ is obtained using the value $(1/\sigma_0(X))$, which is proportional to the estimated value of occurrence probability of the expected value of the signal waveform at each X-position, as weight for each X-position, the expected value being the waveform template $\mu_0(X)$'s value at each X-position. That is, in the calculation of the correlation value $CR_1(\delta X)$, when the occurrence probability of the expected value $\mu_0(X)$ is high, the weight is large, and when the occurrence probability of the expected value $\mu_0(X)$ is low, the weight is small. As a result, in a X-position (e.g., position $X_2$ in FIG. 6), where the light intensity of any of the signal waveforms $WT_k(X)$ takes values around the expected value, the weight is large, and in a X-position (e.g., position $X_3$ in FIG. 6), where the measured light intensity varies among the signal waveforms, the weight is small, the plurality of signal waveforms $WT_k(X)$ being used to generate the waveform template $\mu_0(X)$. Therefore, the correlation value $CR_1(\delta X)$ is obtained by equation (6) which reflects the entire pattern information corresponding to the plurality of signal waveforms $WT_k(X)$ used to generate the waveform template $\mu_0(X)$.

Figure 9A:
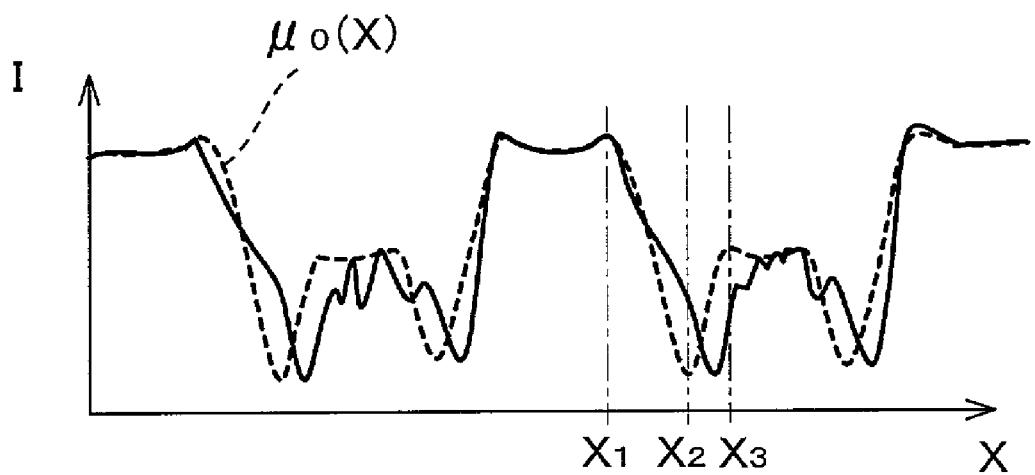
FIG. 9 is a view for explaining template matching.
Figure 9B:
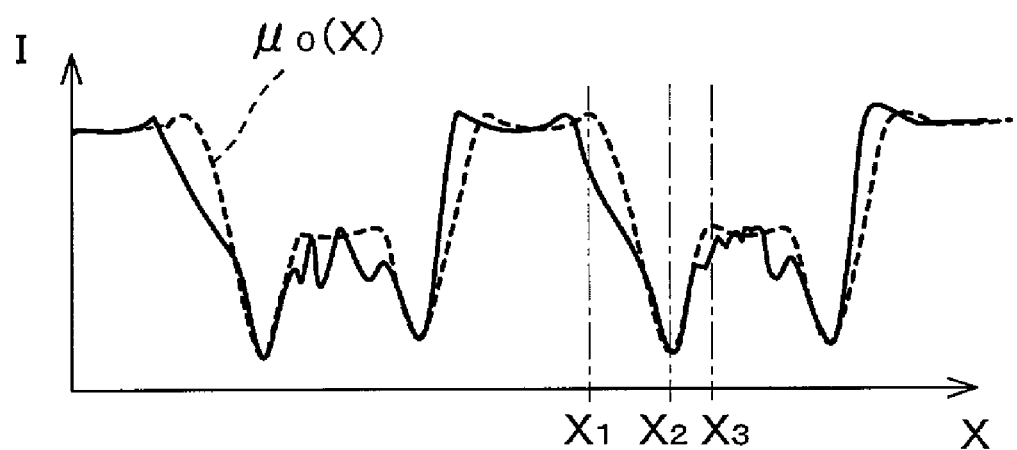

Therefore, considering signal waveforms of the mark $MX_1$ represented by solid lines of FIG. 9A and FIG. 9B, FIG. 9A shows a case where the degree of matching is judged to be maximum according to the correlation value given by equation (2) although there is some difference between the measured signal waveform and the waveform template $\mu_0(X)$ represented by the dotted line. Meanwhile, as shown in FIG. 9B, in a case where the degree of matching is judged to be maximum according to the correlation value given by equation (6), there is smaller difference between the measured signal waveform and the waveform template $\mu_0(X)$ represented by the dotted line. That is, such judgment of the degree of matching is performed that X-positions are given importance where the light intensity of any of the signal waveforms $WT_k(X)$ used to generate the waveform template $\mu_0(X)$ takes a value close to the expected value.

And the matching judgment unit 33 obtains a value of the X-position parameter $\delta X_{MAX1}$ where the correlation value $CR_1(\delta X)$ is maximum, and stores it into the pattern-matching-result storing area 44. Up to this, the template matching is completed.

Next, in step 211 of FIG. 5, according to instructions from the controller 39, the template generator 32 replaces the waveform template and the probability template. In this replacement, first, the template generator 32 reads out the picked-up data of the mark $MX_1$, the initial waveform template $\mu_0(X)$, and the pattern-matching result $\delta X_{MAX1}$ respectively from the picked-up-data storing area 41, the waveform-template storing area 42, and the pattern-matching-result storing area 44.

Subsequently, based on the signal waveform $WP_1(X)$ corresponding to the picked-up data of the mark $MX_1$, the initial waveform template $\mu_0(X)$, and the pattern-matching result $\delta X_{MAX1}$, the template generator 32 calculates a new waveform template $\mu_1(X)$ by $$\mu_0(X) = \{3\mu_0(X) + WP_1(X + \delta X_{MAX})\}/(3+1) \quad (7),$$

and the template generator 32 stores the new waveform template $\mu_1(X)$ into the waveform-template storing area 42.

Next, the template generator 32 reads out the initial probability template $\sigma_0(X)$ from the probability-template storing area 43, and based on the signal waveform $WP_1(X)$, the initial waveform template $\mu_0(X)$, the new waveform template $\mu_1(X)$, the initial probability template $\sigma_0(X)$, and the pattern-matching result $\delta X_{MAX1}$, the template generator 32 calculates a new probability template $\sigma_0(X)$ by $$\sigma_1(X)=[\{3\sigma_0(X)^2+4(\mu_1(X)-\mu_0(X))^2+(WP_1(X+\delta X_{MAX1})-\mu_1(X))^2\}/4]^{1/2} \quad (8),$$

and the template generator 32 stores the new probability template $\sigma_1(X)$ into the probability-template storing area 43.

That is, based on four signal waveforms that are the signal waveform $WP_1(X)$ and the three signal waveforms $WT_k(X)$ (k=one to three) used to generate the initial waveform template $\mu_0(X)$ and the initial probability template $\sigma_0(X)$, the template generator 32 generates the new waveform template $\mu_1(X)$ and the new probability template $\sigma_1(X)$, and replaces the waveform template and the probability template respectively with the new waveform template $\mu_1(X)$ and the new probability template $\sigma_1(X)$. As a result, when the signal waveform $WP_1(X)$ has a tendency different from any of the signal waveforms $WT_k(X)$, the waveform template $\mu_1(X)$ and the probability template $\sigma_1(X)$ reflecting the tendency of the signal waveform $WP_1(X)$ are obtained, the waveform template $\mu_1(X)$ and the probability template $\sigma_1(X)$ reflecting a real probability distribution more than the initial waveform template $\mu_0(X)$ and the initial probability template $\sigma_0(X)$ do. Also, even when the signal waveform $WP_1(X)$ is similar to one of the signal waveforms $WT_k(X)$, the waveform template and the probability template reflecting a real probability distribution more than the initial waveform template $\mu_0(X)$ and the initial probability template $\sigma_0(X)$ are obtained.

Next, in step 213, according to instructions from the controller 39, the mark position calculation unit 38 calculates the position of the mark $MX_1$. In this position calculation, first, the mark position calculation unit 38 takes in the position information (velocity information) WPV of the wafer W measured at the time of picking up the mark $MX_1$, the information being supplied from the wafer interferometer 18 through the stage control system 19, and reads out the pattern-matching result $\delta X_{MAX1}$ from the pattern-matching-result storing area 44. And based on the X-position of the wafer W extracted from the position information (velocity information) WPV and the pattern-matching result $\delta X_{MAX1}$, the mark position calculation unit 38 calculates the X-position $PX_1$ of the mark $MX_1$ on the wafer, and stores it into the mark-position storing area 45. In this way, the calculation of the X-position $PX_1$ of the mark $MX_1$ on the wafer is completed.

Next, in step 215, it is tested whether all X-positions of M number of selected marks $MX_i$ have been detected. In the above, because the position of only one mark $MX_1$ has been detected, the answer in step 215 is NO, and then the sequence advances to step 217.

In step 217, the controller 39 moves the wafer W so that the next mark, i.e. the second mark $MX_2$, is within the picking-up sight. This movement of the wafer W is performed by the controller 39 controlling the wafer driver 24 via the stage control system 19 on the basis of the pre-alignment result and moving the wafer stage WST.

After that, until in step 215 it is found that all X-positions of M number of selected marks $MX_i$ have been detected, the positions of the marks $MX_i$(i=two to M) are detected in the same manner as for the mark $MX_1$ using the waveform template $\mu_{i-1}(X)$ and the probability template $\sigma_{i-1}(X)$ replaced on the previous position detection. Note that a new waveform template $\mu_i(X)$ and a probability template $\sigma_i(X)$ are generated in step 211 on the X-position detection of the mark $MX_i$ by calculating $$\mu_i(X)=\{(2+i)\cdot\mu_{i-1}+WP_i(X+\delta X_{MAXi})\}/(3+i) \quad (9)$$

$$\sigma_i(X)=[\{(2+i)\cdot\sigma_{i-1}(X)^2+(3+i)\cdot(\mu_i(X)-\mu_{i-1}(X))^2+(WP_i(X+\delta MAX_i)-\mu_i(X))^2\}/(3+i)]^{1/2} \quad (10).$$

In this way, when, in step 215, it is determined that all X-positions of M number of selected marks $MX_i$(i=one to M) are detected, the position detection of the mark MX for detecting X-positions is completed.

Next, the position detection of marks $MY_h$(h=one to N) for detecting Y-positions on the wafer W is performed in the same way as in the position detection of the marks $MX_i$ (i=one to M) for detecting X-positions on the wafer W. Then the X-position $PX_i$ of the mark $MX_i$ and the Y-position $PY_h$ of the mark $MY_h$ are stored into the mark-position storing area 45. In this way, the position detection of the selected mark $MX_i$, $MY_h$ is completed.

Subsequently, the controller 39 reads out the X-position $PX_i$ and the Y-position $PY_h$ from the mark-position storing area 45, and based on the X-position $PX_i$ and the Y-position $PY_h$, the arrangement coordinate of the shot area SA on the wafer is calculated using statistical process according to a technology disclosed in, for example, Japanese Patent Laid-Open No. 61-44429 and U.S. Pat. No. 4,780,617 corresponding thereto, and Japanese Patent Laid-Open No. 2-54103 and U.S. Pat. No. 4,962,318 corresponding thereto. The disclosures in the above Japanese Patent Laid-Opens and U.S. patents are incorporated herein by reference as long as the national laws in designated states or elected states, to which this international application is applied, permit.

Then while illuminating the slit-like illumination area (its center almost coinciding with the optical axis AX) on the reticle R with the illumination light IL, the controller 38 controls and moves the reticle stage RST and the wafer stage WST respectively in mutually opposite directions along the scanning direction (Y-direction) at a velocity ratio corresponding to the projection magnification on the basis of the arrangement of the shot area. In this way, a pattern in the pattern area of the reticle R is reduced and transferred onto the wafer W.

In the way described above, when pattern matching (canonical, normalized correlation) is performed, the exposure apparatus 100 of the present embodiment calculates the sum of products with canonical weight using the waveform template and probability template, and performs correlation search taking positional-detection significance of information of each position into account, thereby being able to accurately detect the positions of the alignment marks MX, MY on the wafer.

Additionally, on the detection of the positions of the alignment marks MX, MY, edge detection, binarization, peak detection, etc., regarding picked-up data are unnecessary, and therefore the detection is accurate and highly robust against noise.

Furthermore, at each time of position detection of the mark, the waveform template and probability template used for pattern matching regarding the mark are replaced with a new waveform template and probability template generated by adding the signal waveform regarding the mark, and therefore pattern matching with desirable matching-accuracy can be performed.

In addition, based on the accurately detected positions of the alignment marks MX, MY, the alignment of the wafer W is performed, and therefore accurate alignment can be performed.

In addition, because accurately aligning the wafer W and performing exposure, a pattern on the pattern area of the reticle R can be accurately transferred onto the shot area of the wafer W.

As described above, the exposure apparatus of the present embodiment is made by assembling various sub-systems including elements that are mentioned in the claims of the present invention such that mechanical accuracy, electrical accuracy, and optical accuracy of the whole system are kept within a predetermined range. To ensure these kinds of accuracy, after and before the assembly, adjustment to achieve optical accuracy of various kinds of optical systems, adjustment to achieve mechanical accuracy of various kinds of mechanical systems, and adjustment to achieve electrical accuracy of various kinds of electrical systems are performed. The process of assembling the exposure apparatus with the various sub-systems includes mechanical connection between the various kinds of sub-systems, wiring of electrical circuits, plumbing of air pressure circuits, and the like. Needless to say, before the process of assembling the exposure apparatus with the various sub-systems, each sub-system should be assembled. After the process of assembling the exposure apparatus with the various sub-systems, comprehensive adjustment is performed to ensure the various kinds of accuracy of the whole exposure apparatus. Note that it is preferable to make the exposure apparatus in a clean room where the temperature, the degree of cleanness, and the like are controlled.

Next, the manufacture of devices by using the above exposure apparatus and the method will be described.

Figure 10:
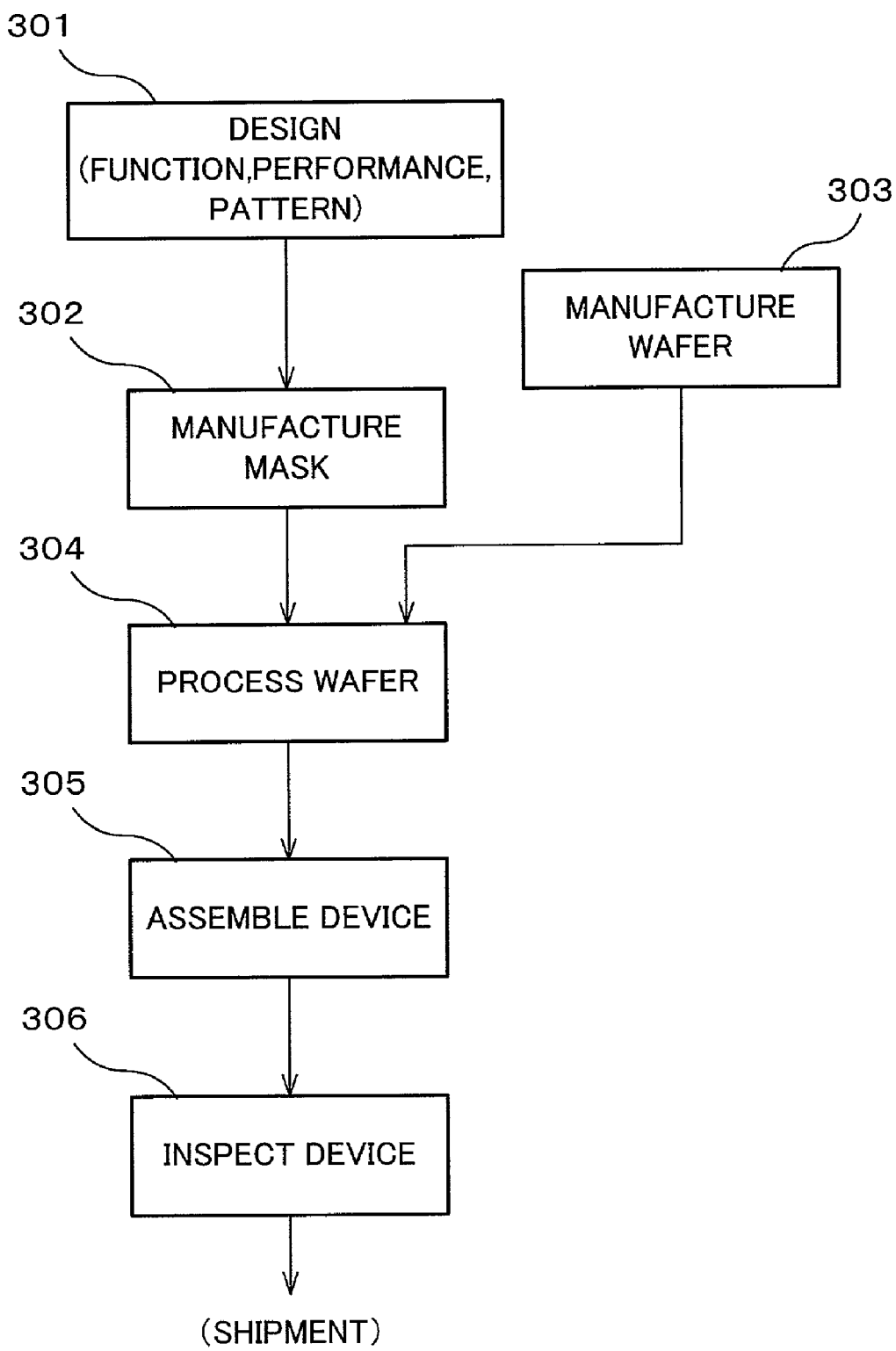
FIG. 10 is a flow chart for explaining a method of manufacturing devices using the exposure apparatus shown in FIG. 1.

FIG. 10 is a flow chart for the manufacture of a device (a semiconductor chip such as IC or LSI, liquid crystal panel, CCD, thin magnetic head, micro machine, or the like) in this embodiment. As shown in FIG. 10, in step 301 (design step), function/performance design for the device (e.g., circuit design for a semiconductor device) is performed and pattern design is performed to implement the function. In step 302 (mask manufacturing step), a mask on which the designed circuit pattern is formed is produced. In step 303 (wafer manufacturing step), a wafer is manufactured by using silicon material or the like.

In step 304 (wafer processing step), an actual circuit and the like are formed on the wafer by lithography or the like using the mask and wafer prepared in steps 301 to 303, as will be described later. In step 305 (device assembly step), devices are assembled by using the wafer processed in step 304. Step 305 includes processes such as dicing, bonding, and packaging (chip encapsulation).

Finally, in step 306 (inspection step), a test on the operation of the devices, durability test, and the like are performed. After these steps, the process is complete and the devices are shipped out.

Figure 11:
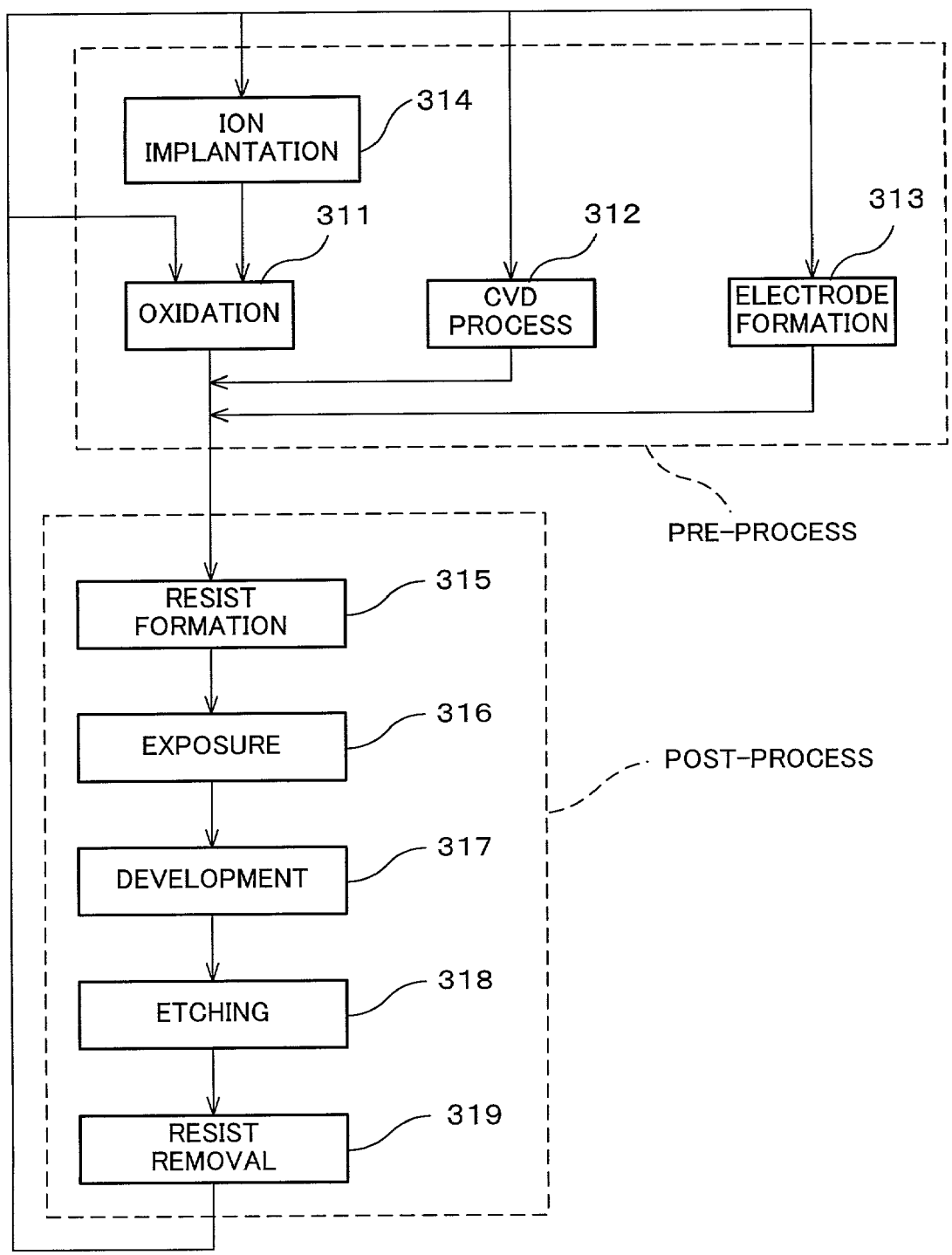
FIG. 11 is a flow chart showing a process of the wafer process step of FIG. 10.

FIG. 11 is a flow chart showing a detailed example of step 304 described above in manufacturing semiconductor devices. Referring to FIG. 11, in step 311 (oxidation step), the surface of a wafer is oxidized. In step 312 (CVD step), an insulating film is formed on the wafer surface. In step 313 (electrode formation step), electrodes are formed on the wafer by vapor deposition. In step 314 (ion implantation step), ions are implanted into the wafer. Steps 311 to 314 described above constitute a pre-process for each step in the wafer process and are selectively executed in accordance with the processing required in each step.

When the above pre-process is completed in each step in the wafer process, a post-process is executed as follows. In this post-process, first of all, in step 315 (resist formation step), the wafer is coated with a photosensitive agent. In step 316, the above exposure apparatus transfers the circuit pattern on the mask onto the wafer aligned by the above method. In step 317 (developing step), the exposed wafer is developed. In step 318 (etching step), an exposing member on portions other than portions where the resist is left is removed by etching. In step 319 (resist removing step), the unnecessary resist after the etching is removed.

By repeatedly performing these pre-process and post-process, a multiple-layer circuit pattern is formed on each shot-area of the wafer.

As described above, devices on which a fine pattern is accurately formed are manufactured with high productivity.

Note that although, in the above embodiment, three signal waveforms are measured in advance, two, or four or more waveforms may be used for generating the initial waveform template and the initial probability template.

Additionally, note that although, in the above embodiment, a line-and-space mark that is one-dimensional mark is used as the position detection mark to detect one-dimensional position of each mark, another kind of mark may be used. For example, a two-dimensional mark such as a box-in-box mark may be used to detect the two-dimensional position of each mark. To detect the two dimensional position of the two-dimensional mark, the above one-dimensional position detection may be performed twice, or two-dimensional template matching, for a two-dimensional signal waveform of the two-dimensional mark, into which the one-dimensional template matching for the one-dimensional signal in the above embodiment is extended may be used.

In addition, instead of obtaining the shot arrangement coordinate, by obtaining the amount of a step-pitch that is the distance from one exposure area to the next one on the wafer, transition from one exposure area to the another may be performed by use of the step-pitch.

Furthermore, although, in the above embodiment, a fly-eye lens is used as an optical integrator (homogenizer), a rod-integrator may be used. In an illumination optical system using the rod integrator, the rod integrator is so placed that its emitting surface is almost conjugated with the pattern surface of the reticle R. Note that such an illumination optical system using a rod integrator is disclosed in, for example, U.S. Pat. No. 5,675,401. The disclosure in the above U.S. patent is incorporated herein by reference as long as the national laws in designated states or elected states, to which this international application is applied, permit. Moreover, the combination of a fly-eye lens and rod integrator or a double optical integrator that is composed of two fly-eye lenses or rod integrators in series may be used.

In addition, although the above embodiment described a case where the present invention is applied to a scanning exposure apparatus of a step-and-scan method, the scope of the present invention is not limited to that. The present invention can be suitably applied to a stationary-exposure-type exposure apparatus such as a stepper.

Additionally, even in, for example, an exposure apparatus using ultraviolet light, as its projection optical system, a reflection system including only reflection optical elements or a reflection/refraction system (catadioptric system) including reflection optical elements and refraction optical elements may be employed. As the reflection/refraction-type projection optical system, a reflection/refraction system comprising a beam splitter and a concave mirror as reflection optical elements, which is disclosed in, for example, Japanese Patent Laid-Open No. 8-171054 and U.S. Pat. No. 5,668,672 corresponding thereto, and Japanese Patent Laid-Open No. 10-20195 and U.S. Pat. No. 5,835,275 corresponding thereto, can be used, or a reflection/refraction system comprising not a beam splitter but a concave mirror, etc., as reflection optical elements, which is disclosed in Japanese Patent Laid-Open No. 8-334695 and U.S. Pat. No. 5,689,377 corresponding thereto, and Japanese Patent Laid-Open No. 10-3039 and U.S. Pat. No. 873,605 (application date: Jun. 12, 1997) corresponding thereto, can be employed. The disclosures in the above Japanese Patent Laid-Opens, U.S. patent, and U.S. patent application are incorporated herein by reference as long as the national laws in designated states or elected states, to which this international application is applied, permit.

Also, a reflection/refraction system can be employed which comprises a plurality of refraction optical elements and two mirrors (a main mirror being a concave mirror and a sub-mirror that is a back surface mirror of which the reflection surface is formed on the opposite side to the incident surface of a refraction element or plane parallel plate) that are disposed along one axis, and has the intermediate image, formed by those refraction optical elements, of a reticle pattern again imaged on a wafer using the main mirror and sub-mirror, the reflection/refraction system being disclosed in Japanese Patent Laid-Open No. 10-104513 and U.S. Pat. No. 5,488,229 corresponding thereto. In this reflection/refraction system, the main mirror and sub-mirror are disposed in series with the plurality of refraction optical elements, and an illumination light passes through a portion of the main mirror, is reflected by the sub-mirror and the main mirror in turn, passes through a portion of the sub-mirror and reaches the wafer. The disclosures in the above Japanese Patent Laid-Open and U.S. patent are incorporated herein by reference as long as the national laws in designated states or elected states, to which this international application is applied, permit.

Furthermore, as the reflection/refraction-type projection optical system, a reduction system may be employed which has, e.g., a circular image field, is telecentric on both the object plane side and image plane side, and has a reduction ratio of, e.g., 1/4 or 1/5. Also, in a scanning exposure apparatus comprising this reflection/refraction-type projection optical system, the illumination area of the illumination light may be a rectangular-slit-shaped area whose center almost coincides with the optical axis of the projection optical system and which extends along a direction almost perpendicular to the scanning direction of a reticle or wafer. By using a scanning exposure apparatus comprising such a reflection/refraction-type projection optical system, it is possible to accurately transfer a fine pattern of about 100 nm L/S pattern onto wafers even with $F_2$ laser light having, for example, the wavelength of 157 nm as exposure light.

Furthermore, as a vacuum ultraviolet light, ArF excimer laser light or $F_2$ laser light is used. However, in a case of containing only a beam-monitor mechanism and reference wavelength light source in the same environment-controlled chamber as the projection optical system, a higher harmonic wave may be used which is obtained with wavelength conversion into ultraviolet by using non-linear optical crystal after having amplified a single wavelength laser light, infrared or visible, emitted from a DFB semiconductor laser device or a fiber laser by a fiber amplifier having, for example, erbium (or erbium and ytterbium) doped.

For example, considering that the oscillation wavelength of a single wavelength laser is in the range of 1.51 to 1.59 um, an eight-time-higher harmonic wave of which the wavelength is in the range of 189 to 199 nm or a ten-time-higher harmonic wave of which the wavelength is in the range of 151 to 159 nm is emitted. Especially, when the oscillation wavelength is in the range of 1.544 to 1.553 um, an eight-time-higher harmonic wave of which the wavelength is in the range of 193 to 194 nm, that is, almost the same as ArF excimer laser light (ultraviolet light) is obtained, and when the oscillation wavelength is in the range of 1.57 to 1.58 um, a ten-time-higher harmonic wave of which the wavelength is in the range of 157 to 158 nm, that is, almost the same as $F_2$ laser light (ultraviolet light) is obtained.

Furthermore, when the oscillation wavelength is in the range of 1.03 to 1.12 um, a seven-time-higher harmonic wave of which the wavelength is in the range of 147 to 160 nm is emitted, and, especially, when the oscillation wavelength is in the range of 1.099 to 1.106 um, a seven-time-higher harmonic wave of which the wavelength is in the range of 157 to 158 nm, that is, almost the same as $F_2$ laser light (ultraviolet light) is obtained. In this case, for example, ytterbium-doped fiber laser can be employed as the single wavelength laser.

Moreover, the present invention can be applied not only to an exposure apparatus for producing micro devices such as semiconductor devices but also to an exposure apparatus that transfers a circuit pattern onto a glass substrate or silicon wafer so as to produce reticles or masks used by a light exposure apparatus, EUV (Extreme Ultraviolet) exposure apparatus, X-ray exposure apparatus, electron beam exposure apparatus, etc. Incidentally, in an exposure apparatus using DUV (far ultraviolet) light or VUV (vacuum ultraviolet) light, a transmission-type reticle is employed in general. And as the substrate of the reticle, quartz glass, quartz glass with fluorine doped, fluorite, magnesium fluoride, or quartz crystal is employed. And an X-ray exposure apparatus of a proximity method or electron beam exposure apparatus employs a transmission-type mask (stencil-mask, membrane-mask); an EUV exposure apparatus employs a reflection-type mask, and as the substrate of the mask, silicon wafer or the like is employed.

Note that the present invention can be applied not only to a wafer exposure apparatus used in the production of semiconductor devices but also to an exposure apparatus that transfers a device pattern onto a glass plate and is used in the production of displays such as liquid crystal display devices and plasma displays, an exposure apparatus that transfers a device pattern onto a ceramic plate and is used in the production of thin magnetic heads, and an exposure apparatus used in the production of pick-up devices (CCD, etc.).

In addition, in the above embodiment, position detection of the alignment marks on a wafer and alignment of the wafer have been described. However, position detection and alignment according to the present invention can be applied to position detection of the alignment marks on a reticle and alignment of the reticle, and also to other units than exposure apparatuses such as a unit to observe objects and a unit that is used to detect positions of objects and align them in an assembly line, process line or inspection line.

In addition, the application of the pattern matching according to the present invention is not limited to the signal waveforms of marks on a wafer, and can also cover any object that is measured using pattern matching that generates a template from measured signal waveforms and performs template matching. Also, the pattern matching of the present invention can be applied not only to a case where a signal value varies according to its position but also to a case where signal values vary according to time.

Furthermore, the probability distribution estimated in generating a template pattern is not limited to a normal distribution. When more appropriate a probability distribution than a normal distribution is known, the waveform template and probability template may be generated based on that probability distribution.

INDUSTRIAL APPLICABILITY

As described above, by using the pattern matching method and pattern matching unit according to the present invention, template matching using a reasonable template can be performed on newly measured signal waveforms. Therefore, the pattern matching method and pattern matching unit according to the present invention are suitable to perform accurate signal processing through template matching.

In addition, by using signal waveforms measured at specific marks formed on a body to be detected, the position detection method and position detector according to the present invention generate the waveform template and the probability template, and perform template matching to detect the positions of the specific marks as position detection objects. Therefore, the position detection method and position detector according to the present invention are suitable to accurately detect the positions of the specific marks formed on the body to be detected.

Additionally, in the position detection method and position detector according to the present invention, based on the positions of the specific marks detected by the position detection method of the present invention, the body on which the specific marks are formed is positioned. Therefore, the alignment method and alignment unit according to the present invention are suitable to accurately align the body to be detected.

In addition, the exposure method and exposure apparatus according to the present invention detect the positions of a predetermined number of position detection marks formed on a substrate through use of the position detection method, align the substrate on the basis of the detection results, and transfer a predetermined pattern onto divided areas, thereby being suitable to perform multi-layer-exposure for forming a multi-layer pattern with improved accuracy of superposition. Therefore, the exposure apparatus according to the present invention is suitable for manufacturing devices on which a fine pattern is formed.

What is claimed is:

1. A pattern matching method for performing template matching on a waveform of a signal, a value of the signal varying according to at least a parameter, the pattern matching method comprising:
   a first step of estimating an occurrence probability distribution of signal values at respective values of the parameter based on a plurality of measured signal waveforms;
   a second step of generating a waveform template including an expected value of signal value at each value of the parameter and a probability template including a piece of occurrence probability information of the expected value at each value of the parameter based on the occurrence probability distribution; and
   a third step of performing template matching between a newly measured signal waveform and the waveform template by using the piece of occurrence probability information of each of the expected values, which compose the probability template, as a piece of weight information at each value of the parameter.

2. The pattern matching method according to claim 1, wherein the occurrence probability distribution is a normal distribution.

3. The pattern matching method according to claim 1, wherein each of the expected values is an average value of signal values measured at each value of the parameter, and wherein each piece of the occurrence probability information is in accord with a probability density function value, for the respective expected value, of the occurrence probability distribution.

4. The pattern matching method according to claim 1, further comprising:
   a fourth step in which a new waveform template including a new, expected value of a signal value at each value of the parameter and a new probability template including a piece of occurrence probability information of the new, expected value at each value of the parameter are generated based on the new signal waveform and the occurrence probability distribution; and
   wherein the fourth step and the third step are repeated sequentially.

5. A pattern matching method of performing template matching between a waveform template, as a registered template, generated based on a plurality of measured signal waveforms and a subsequently measured signal waveform, comprising:
   a first step of performing template matching between the registered template and a newly measured signal waveform;
   a second step of estimating an occurrence probability distribution of signal values at respective values of a parameter based on a plurality of waveforms including the signal waveform used for generating the registered template and the newly measured signal waveform, the parameter relating to changes of a waveform; and
   a third step of generating, based on the occurrence probability distribution, a new template including a waveform template including expected values of the signal values at the respective values of the parameter and a probability template including a piece of occurrence probability information of the expected values, and replacing the registered template with the new template; and
   wherein the first step, the second step and the third step are repeated sequentially.

6. The pattern matching method according to claim 5, wherein the occurrence probability distribution is a normal distribution.

7. The pattern matching method according to claim 5, wherein each of the expected values is an average value of signal values measured at each value of the parameter, and wherein each piece of the occurrence probability information is in accord with a probability density function value, for the respective expected value, of the occurrence probability distribution.

8. A pattern matching unit that performs template matching on a waveform of a signal, a value of the signal varying according to value change of at least a parameter, the pattern matching unit comprising:
   a template generator which generates a waveform template including an expected value of a signal value at each value of the parameter and a probability template including a piece of occurrence probability information of the expected value at each value of the parameter based on the occurrence probability distribution of signal values for the respective values of the parameter, the distribution being estimated from a plurality of measured signal waveforms; and a matching judgment unit which is electrically connected to the template generator and which performs template matching between a newly measured signal waveform and the waveform template by using pieces of occurrence probability information of the expected values as pieces of weight information at respective values of the parameter, the pieces of occurrence probability information composing the probability template.

9. The pattern matching unit according to claim 8, wherein the template generator generates a new waveform template and a new probability template based on the new signal waveform and the occurrence probability distribution.

10. A pattern matching unit that performs template matching, comprising:

a template generator which generates a waveform template based on a plurality of measured signal waveforms and registers the generated template as a registered template;

a matching judgment unit which is electrically connected to the template generator and which performs template matching between a newly measured signal waveform and the registered template; and an estimating unit which estimates an occurrence probability distribution of signal values at respective values of a parameter based on a plurality of waveforms including the signal waveform used for generating the registered template and the newly measured signal waveform, the parameter relating to changes of a waveform, wherein the template generator generates, based on the occurrence probability distribution, a new template including a waveform template including expected values of the signal values at the respective values of the parameter and a probability template including a piece of occurrence probability information of the expected values, and replaces the registered template with the new template.

11. A pattern matching method of performing template matching between a waveform template, as a registered template, generated based on a plurality of measured signal waveforms and a subsequently measured signal waveform, comprising:

a first step of performing template matching between the registered template and a newly measured signal waveform;

a second step of estimating an occurrence probability distribution of signal values at respective values of a parameter based on a plurality of waveforms including the newly measured signal waveform and the registered template, the parameter relating to changes of a waveform; and a third step of generating, based on the occurrence probability distribution, a new template including a waveform template including expected values of the signal values at the respective values of the parameter and a probability template including a piece of occurrence probability information of the expected values, and replacing the registered template with the new template, wherein the first step, the second step and the third step are repeated sequentially.

12. A pattern matching unit that performs template matching, comprising:

a template generator which generates a waveform template based on a plurality of measured signal waveforms and registers the generated template as a registered template;

a matching judgment unit which is electrically connected to the template generator and which performs template matching between a newly measured signal waveform and the registered template; and an estimating unit which estimates an occurrence probability distribution of signal values at respective values of a parameter based on a plurality of waveforms including the newly measured signal waveform and the registered template, the parameter relating to changes of a waveform, wherein the template generator generates, based on the occurrence probability distribution, a new template including a waveform template including expected values of the signal values at the respective values of the parameter and a probability template including a piece of occurrence probability information of the expected values, and replaces the registered template with the new template.

* * * * *

UNITED STATES PATENT AND TRADEMARK OFFICE
CERTIFICATE OF CORRECTION

| | | |
|---|---|---|
| PATENT NO. | : 7,184,594 B1 | Page 1 of 1 |
| APPLICATION NO. | : 09/869293 | |
| DATED | : February 27, 2007 | |
| INVENTOR(S) | : Yoshida | |

It is certified that error appears in the above-identified patent and that said Letters Patent is hereby corrected as shown below:

On the title page, Item (54) and column 1, the title is incorrect. Item (54) and column 1 should read:

-- (54)  PATTERN MATCHING METHOD AND UNIT, POSITIONS DETECTION METHOD AND UNIT, ALIGNMENT METHOD AND APPARATUS, AND DEVICE AND DEVICE MANUFACTURING METHOD --

Signed and Sealed this

Fifth Day of June, 2007

JON W. DUDAS
*Director of the United States Patent and Trademark Office*